United States Patent
Ochiai et al.

(10) Patent No.: US 9,406,399 B2
(45) Date of Patent: *Aug. 2, 2016

(54) BIDIRECTIONAL SHIFT REGISTER AND IMAGE DISPLAY DEVICE USING THE SAME

(71) Applicants: Japan Display Inc., Tokyo (JP); PANASONIC LIQUID CRYSTAL DISPLAY CO., LTD., Himeji-Shi, Hyogo (JP)

(72) Inventors: Takahiro Ochiai, Chiba (JP); Mitsuru Goto, Chiba (JP); Hiroko Sehata, Sapporo (JP); Hiroyuki Higashijima, Konosu (JP)

(73) Assignees: JAPAN DISPLAY INC., Tokyo (JP); PANASONIC LIQUID CRYSTAL DISPLAY CO., LTD., Hyogo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/729,238

(22) Filed: Jun. 3, 2015

(65) Prior Publication Data

US 2015/0270012 A1  Sep. 24, 2015

Related U.S. Application Data

(63) Continuation of application No. 14/449,363, filed on Aug. 1, 2014, now Pat. No. 9,076,403, which is a continuation of application No. 13/164,833, filed on Jun. 21, 2011, now Pat. No. 8,803,783.

(30) Foreign Application Priority Data

Jun. 23, 2010  (JP) ................................ 2010-142838

(51) Int. Cl.
*G11C 19/28* (2006.01)
*G09G 3/36* (2006.01)

(52) U.S. Cl.
CPC .............. *G11C 19/28* (2013.01); *G09G 3/3674* (2013.01); *G09G 3/3677* (2013.01);

(Continued)

(58) Field of Classification Search
CPC ................... G09G 3/3677; G09G 2310/0286; G09G 3/3688; G09G 2300/0426; G09G 3/3611; G09G 3/3614; G09G 2330/021
See application file for complete search history.

(56) References Cited

U.S. PATENT DOCUMENTS 5,859,630 A    1/1999  Huq
8,264,443 B2   9/2012  Lee et al.
(Continued)

FOREIGN PATENT DOCUMENTS

CN    102298895 A    12/2011
JP    2004157508 A    6/2004
(Continued)

*Primary Examiner* — Olga Merkoulova
(74) *Attorney, Agent, or Firm* — TYPHA IP LLC

(57) ABSTRACT

A display device including a bidirectional shift register circuit, including: a plurality of cascade-connected register circuits; various circuits for setting various nodes to various voltage levels responsive to various signals input to various terminals; and an output circuit which outputs the clock pulse as an output pulse when the voltage of the first node is high level, wherein, at the forward shift operation, the bottom dummy register circuit is not input the reset signal and the first node of the bottom dummy register circuit is reset if the initial reset circuit of the bottom dummy register circuit receives the backward trigger signal, and wherein, at the backward shift operation, the top dummy register circuit is not input the reset signal and the first node of the top dummy register circuit is reset if the initial reset circuit of the top dummy register circuit receives the forward trigger signal.

12 Claims, 15 Drawing Sheets

(52) U.S. Cl.
CPC .......... *G09G 2300/0413* (2013.01); *G09G 2300/0465* (2013.01); *G09G 2310/0283* (2013.01); *G09G 2310/0286* (2013.01)

(56) References Cited

U.S. PATENT DOCUMENTS

| | | | |
|---|---|---|---|
| 8,421,736 | B2 | 4/2013 | Park |
| 8,803,783 | B2 * | 8/2014 | Ochiai ............. G09G 3/3677 345/100 |
| 2003/0227433 | A1 | 12/2003 | Moon |
| 2004/0150610 | A1 | 8/2004 | Zebedee et al. |
| 2006/0256066 | A1 * | 11/2006 | Moon ............. G09G 3/3677 345/100 |
| 2011/0310074 | A1 | 12/2011 | Ochiai et al. |

FOREIGN PATENT DOCUMENTS

| | | |
|---|---|---|
| JP | 2009272037 A | 11/2009 |
| WO | 03104879 A2 | 12/2003 |

* cited by examiner

BIDIRECTIONAL SHIFT REGISTER AND IMAGE DISPLAY DEVICE USING THE SAME

CROSS-REFERENCE TO RELATED APPLICATION

This application is a continuation of U.S. patent application Ser. No. 14/449,363, filed on Aug. 1, 2014, which is a continuation of U.S. application Ser. No. 13/164,833, filed Jun. 21, 2011, now U.S. Pat. No. 8,803,783. This application relates to and claims priority from Japanese Patent Application No. 2010-142838, filed on Jun. 23, 2010. The entirety of the contents and subject matter of all of the above is incorporated herein by reference.

BACKGROUND OF THE INVENTION

1. Field of the Invention

The present invention relates to a bidirectional shift register which can switch the order of output of pulses and an image display device which uses the bidirectional shift register to drive the respective scanning lines.

2. Description of the Related Art

Higher resolution of a liquid crystal display device is materialized by improving the arrangement density of pixels in a display portion thereof. As the arrangement density is improved, the arrangement pitch of various kinds of signal lines for supplying signals to pixel circuits becomes finer. Gate lines provided correspondingly to scanning lines of pixels are connected to gate line driving circuits on sides of a display region. A gate line driving circuit includes a shift register for outputting to the respective scanning lines in sequence a voltage which enables writing data to a pixel circuit. As the resolution becomes higher, unit register circuits included in the respective stages of the shift register are also required to be reduced in size.

Ordinarily, a voltage is applied to gate lines in a top to bottom order of an image correspondingly to an order of input of image data in a vertical scanning direction. If the shift register may be driven bidirectionally, input image data may be written to pixel circuits in a bottom to top order when the scan line goes from the bottom to the top. This enables change in the direction of a displayed image with a mechanism that is simpler than that in a structure in which a frame memory for buffering image data or the like is provided and the order of the image data is changed thereby.

A shift register used in a gate line driving circuit or the like includes cascaded unit register circuits in a plurality of stages. Basically, operation in which the respective unit register circuits in the respective stages output a pulse once in an order from one end to the other end of the row of the unit register circuits is performed, the operation being linked with vertical scanning or the like.

FIG. 14 is a circuit diagram illustrating a basic structure of a unit register circuit (see Japanese Patent Application Laid-open Nos. 2004-157508 and 2009-272037). In a unit register circuit in an n-th stage, an output transistor M1 is connected between an output terminal (GOUT[n]) and a clock signal source CK, while a transistor M2 is connected between the terminal (GOUT[n]) and a power supply VOFF. FIG. 15 is a signal waveform chart illustrating operation of the unit register circuit illustrated in FIG. 14. When an output pulse GOUT[n−1] in the previous stage is input to the unit register circuit, a node N3 (one end of a capacitor C) connected to a gate of M1 is connected to a power supply VON, and a potential of the node N3 is pulled up to a High (H) level which is a potential at which the transistor is turned on. When the node N3 is at the H level, a node N4 is connected to the power supply VOFF to be set to a Low (L) level which is a potential at which the transistor is turned off, thereby turning off the transistor M2. In this way, the unit register circuit is in a set state. In this state, when a clock signal CKV (CK) transitions from the L level to the H level, the potential of the node N3 is further pulled up via the capacitor C connected between the gate and a source of the output transistor M1, and the clock signal CKV at the H level is output from the terminal GOUT[n].

On the other hand, in the case of transition of the clock signal CKV from the H level to the L level, the potential of the node N3 is pulled down and a voltage at the output terminal GOUT[n] is also pulled down. Here, linked with a rising edge of a clock signal CKB to an (n+1)th stage, a pulse is generated in an output signal GOUT[n+1] in the subsequent stage, which is input to the unit register circuit in the n-th stage. The pulse of GOUT[n+1] pulls down the potential of the node N3. This pulls up a potential of the node N4, the transistor M2 is turned on, and the output terminal is connected to the power supply VOFF. By the operation, a pulse of the output signal GOUT[n] is output.

SUMMARY OF THE INVENTION

In order to materialize bidirectional drive, both a structure used when the drive is in a forward direction and a structure used when the drive is in a reverse direction are provided in the unit register circuit, and a switch element for switching the directions is built in the unit register circuit. However, a bidirectional shift register which adopts such a unit register circuit has problems that miniaturization thereof is difficult and that it is not suitable for higher resolution of an image display device. On the other hand, a unit register circuit which does not switch the structures according to the direction of the shift may be more liable to present a problem with regard to the stability of operation of the circuit as compared with a unit register which switches the structures.

Further, at the timing at which an output pulse ends in each of the stages, the potential of the node N3 is abruptly pulled down from a potential higher than the H level to the L level, and the transistor M2 is turned on. Such operation is liable to cause unstable behavior at that timing unless timings and waveforms of signals relating to the operation are controlled accurately. For example, there is a problem that the transistor M2 may begin to be turned on before the output transistor M1 is completely turned off, which causes a through current to flow from the power supply VON to the power supply VOFF.

The present invention has been made to solve the above-mentioned problems, and an object of the present invention is to provide a bidirectional shift register which may perform stable bidirectional shift operation with a simple circuit structure and an image display device using the bidirectional shift register.

Solution to Problem

A bidirectional shift register according to one aspect of the present invention includes: a shift register portion including unit register circuits each of which has an output terminal for outputting a pulse and which are cascaded in m stages, where m is an integer which is equal to or larger than 6, for outputting the pulse from a column of the output terminals in a shift order which is one of a forward direction and a reverse direction; a clock signal generating portion for supplying n-phase clock pulses, where n is an integer which is equal to or larger than 3, to the stages of the shift register portion in sequence in the forward direction in forward shift operation of the shift register portion and in the reverse direction in backward shift operation; and a trigger signal generating portion for generating a forward direction trigger signal at a start of forward shift and generating a reverse direction trigger signal at a start of backward shift. The cascaded unit register circuits includes main stages that are unit register circuits in which a load to be driven is connected to the output terminal and dummy stages that are unit register circuits in which a load to be driven is not connected to the output terminal, the main stages forming a successive column and the dummy stages being connected at a top before the column of the main stages and at a bottom after the column of the main stages in the cascade. When $\alpha f$, $\alpha b$, $\beta f$, and $\beta b$ are natural numbers which satisfy both $\alpha f < \beta b < n$ and $\alpha b < \beta f < n$, the unit register circuit in a k-th stage, where k is an integer which satisfies $1 \leq k \leq m$, includes: an output circuit for outputting an output pulse $P_k$ in synchronization with the n-phase clock pulse which is input to the unit register circuit with a reference point of the unit register circuit being at a first potential; both a forward direction set terminal to which an output pulse $P_{k-\alpha f}$ is input as a set signal and a reverse direction set terminal to which an output pulse $P_{k+\alpha b}$ is input as a set signal; at least one of a forward direction reset terminal to which an output pulse $P_{k-\beta f}$ is input as a reset signal and a reverse direction reset terminal to which an output pulse $P_{k-\beta b}$ is input as a reset signal; a set circuit for setting a potential of the reference point to the first potential when the set signal is input; and a reset circuit for setting the potential of the reference point to a second potential when the reset signal is input. Each of the main stages includes both the forward direction reset terminal and the reverse direction reset terminal. A number of the top dummy stages provided is $\beta b$, each of the top dummy stages includes only the forward direction reset terminal as the reset terminal, a number of the bottom dummy stages provided is $\beta f$, and each of the bottom dummy stages includes only the reverse direction reset terminal as the reset terminal. The forward direction trigger signal instead of the output pulse $P_{k-\alpha f}$ is input as the set signal to the forward direction set terminal in top of stages of the dummy stages, and the reverse direction trigger signal instead of the output pulse $P_{k+\alpha b}$ is input as the set signal to the reverse direction set terminal in bottom $\alpha b$ stages of the dummy stages.

An image display device according to the present invention includes: a plurality of pixel circuits arranged in matrix correspondingly to a plurality of scanning lines; a plurality of gate signal lines provided for the plurality of scanning lines, respectively, for supplying a gate signal for controlling writing of image data to the plurality of pixel circuits; and a gate signal line driving circuit including the above-mentioned bidirectional shift register according to the present invention in which the plurality of gate signal lines are connected to the output terminals in the main stages, respectively, for generating the gate signal based on the pulse which is output from the main stages of the shift register portion.

According to the present invention, there may be obtained a bidirectional shift register which may perform stable bidirectional shift operation with a simple circuit structure and an image display device using the bidirectional shift register.

DETAILED DESCRIPTION OF THE INVENTION

Hereinafter, embodiments of the present invention (hereinafter simply referred to as embodiments) are described with reference to the attached drawings.

First Embodiment

Figure 1:
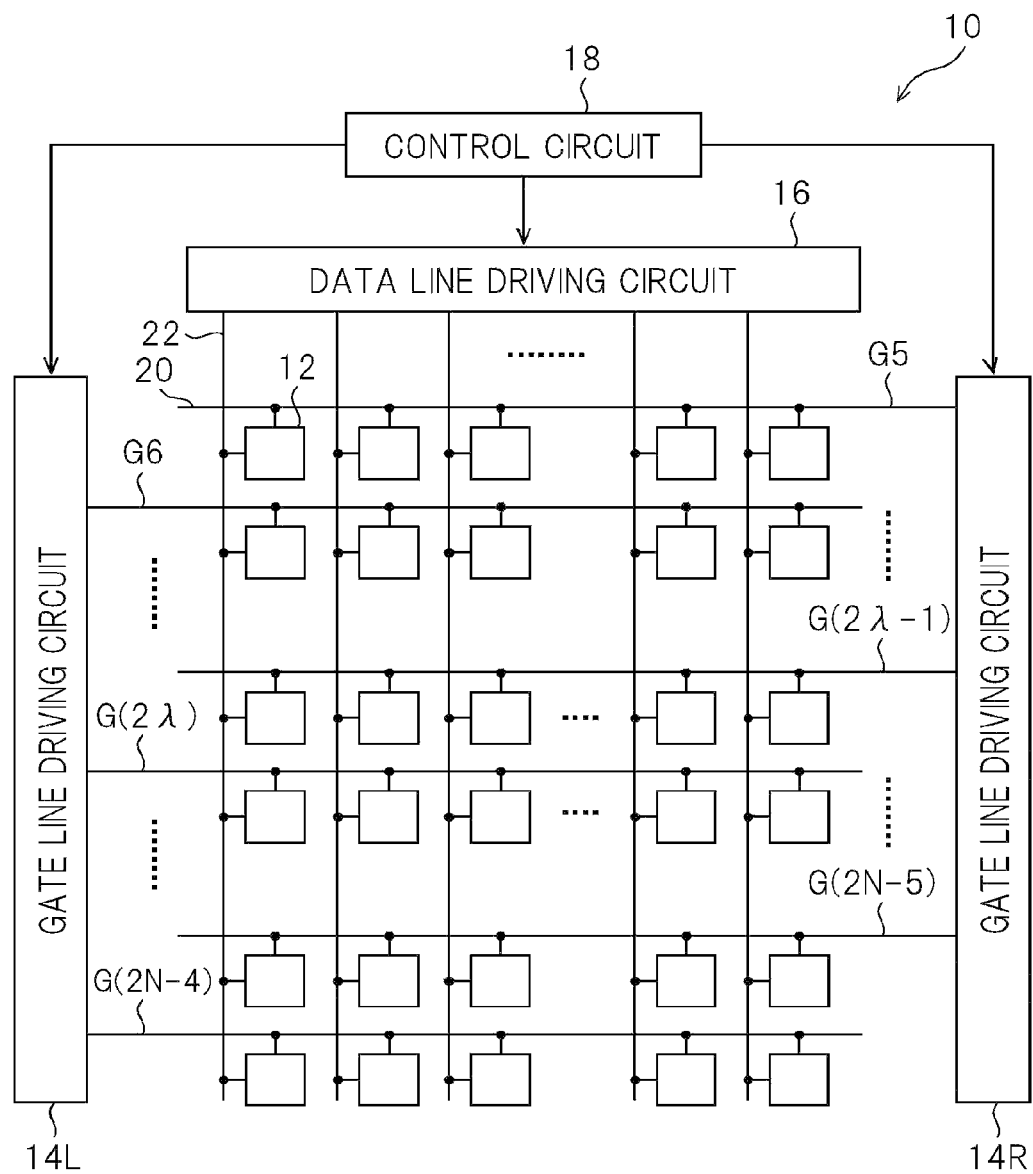
FIG. 1 is a schematic diagram illustrating a structure of an image display device according to a first embodiment.

FIG. 1 is a schematic diagram illustrating a structure of an image display device 10 according to a first embodiment. The image display device 10 is, for example, a liquid crystal display. The image display device 10 includes a plurality of pixel circuits 12, gate line driving circuits 14, a data line driving circuit 16, and a control circuit 18.

The pixel circuits 12 are arranged in a display portion in matrix so as to correspond to pixels.

A plurality of gate signal lines 20 arranged in a vertical direction (column direction) are connected to the gate line driving circuits 14. Each of the gate signal lines 20 is connected to a plurality of pixel circuits 12 arranged in a horizontal direction (row direction). The gate line driving circuits 14 output a gate signal to the plurality of gate signal lines 20 in sequence to render pixel circuits 12 connected to the gate signal lines 20 data writable.

A plurality of data lines 22 arranged in the horizontal direction are connected to the data line driving circuit 16. Each of the data lines 22 is connected to a plurality of pixel circuits 12 arranged in the vertical direction. The data line driving circuit 16 generates, from image data corresponding to one scanning line, signals corresponding to a plurality of pixels forming the scanning line and outputs the signals to the plurality of data lines 22. The pixel signals which are output to the respective data lines 22 are written to pixel circuits 12 which are rendered writable by a gate signal, and the respective pixel circuits 12 control the amount of light emitted from the pixels according to the written pixel signals.

The control circuit 18 controls operation of the gate line driving circuits 14 and of the data line driving circuit 16.

The image display device 10 includes as the gate line driving circuits 14 a gate line driving circuit 14L provided on a left side of the display portion and a gate line driving circuit 14R provided on a right side of the display portion. The gate line driving circuit 14R supplies a gate signal to odd-numbered gate signal lines 20 while the gate line driving circuit 14L supplies a gate signal to even-numbered gate signal lines 20. The gate line driving circuits 14 and the control circuit 18 form the bidirectional shift register and the order of supplying a gate signal to the gate signal lines 20 may be switched between a forward direction from a top to a bottom of the display portion and a reverse direction from the bottom to the top of the display portion.

Figure 2:
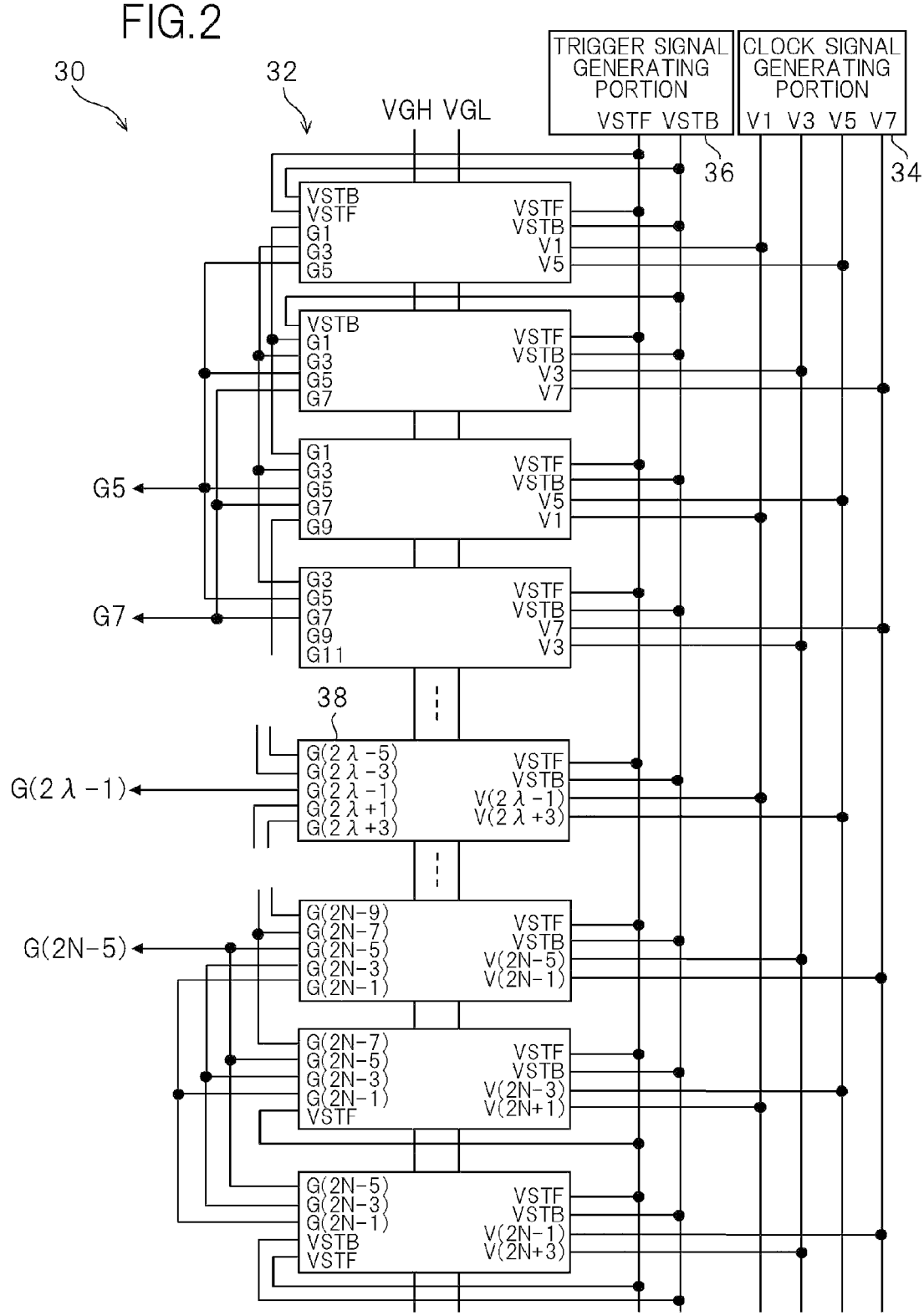
FIG. 2 is a schematic diagram illustrating a structure of a bidirectional shift register according to the first embodiment.
Figure 3:
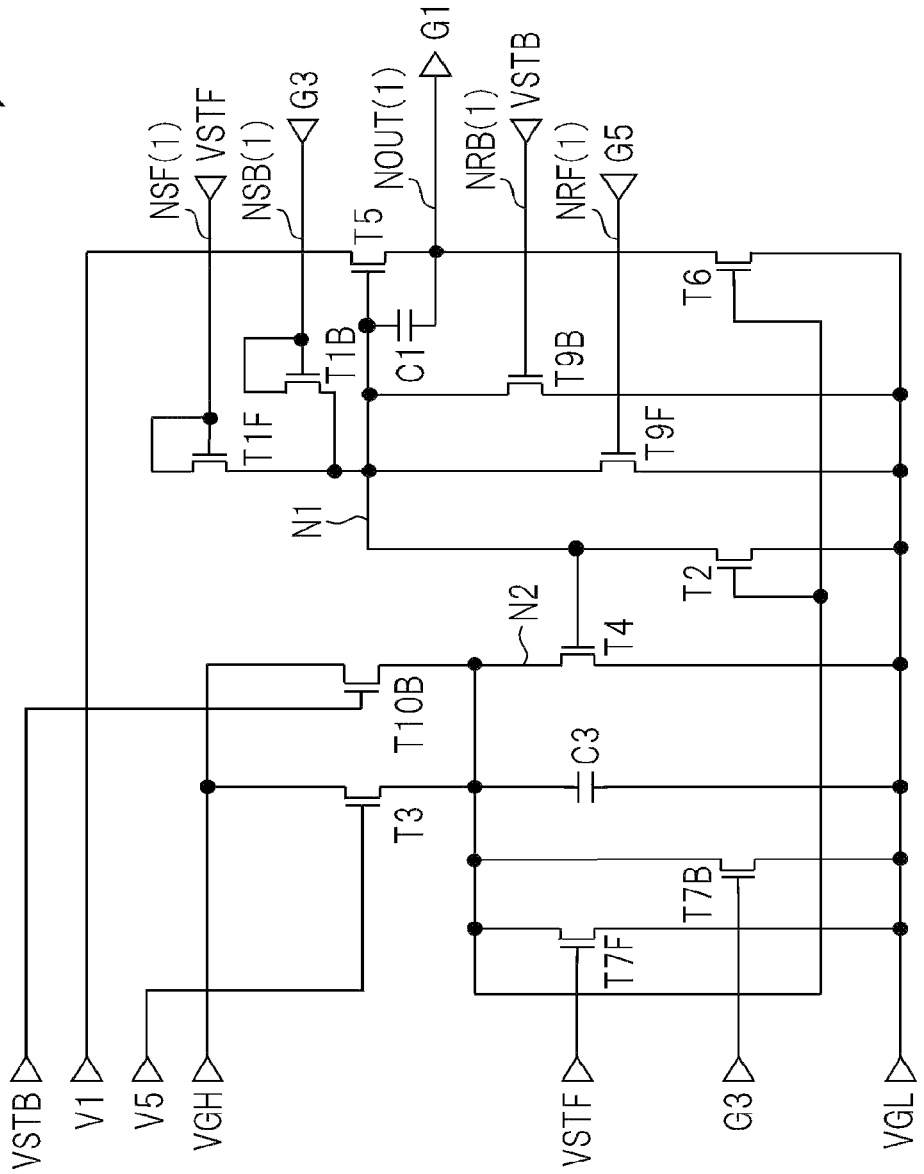
FIG. 3 is a schematic circuit diagram of a unit register circuit in a first stage of the bidirectional shift register according to the first embodiment.
Figure 4:
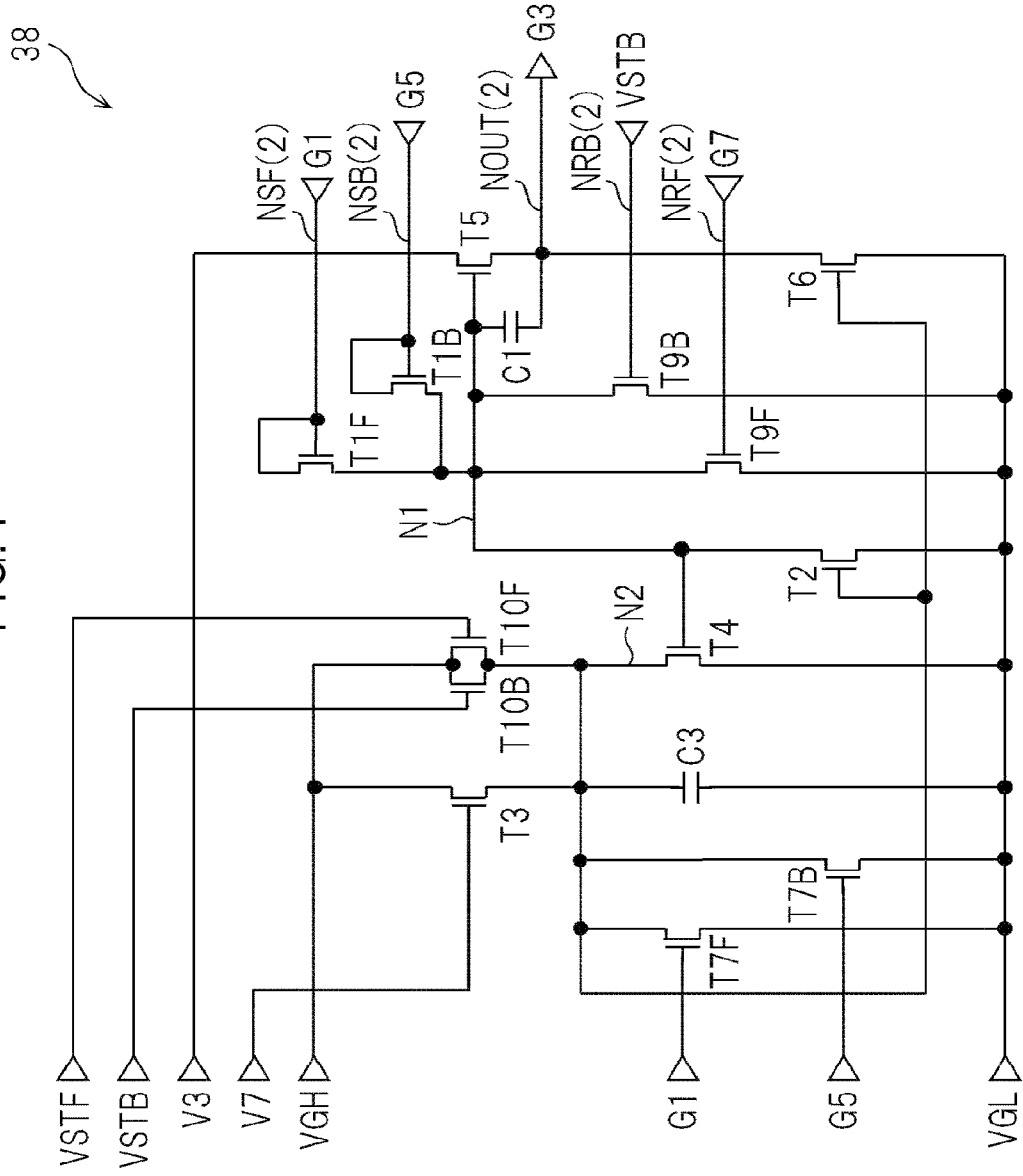
FIG. 4 is a schematic circuit diagram of a unit register circuit in a second stage of the bidirectional shift register according to the first embodiment.

FIG. 2 is a schematic diagram illustrating a structure of a bidirectional shift register 30 used for scanning the gate signal lines 20 of the image display device 10. The bidirectional shift register 30 includes a shift register portion 32, a clock signal generating portion 34, and a trigger signal generating portion 36. The shift register portion 32 is provided in the gate line driving circuits 14 while the clock signal generating portion 34 and the trigger signal generating portion 36 are provided in, for example, the control circuit 18. The shift register portion 32 includes cascaded unit register circuits 38 in a plurality of stages.

FIG. 2 illustrates by way of example a portion of the bidirectional shift register 30 which relates to the shift register portion 32 provided in the gate line driving circuit 14R on the right side. The gate line driving circuit 14R drives in sequence the odd-numbered gate signal lines 20, that is, every other gate signal lines 20 at timings shifted by 2H (H is a horizontal scanning period for one row). On the other hand, the gate line driving circuit 14L drives in sequence the even-numbered gate signal lines 20 at timings shifted by 1H from the odd-numbered gate signal lines 20. The shift register portion 32 of a gate line driving circuit 14 on one side is adapted to be driven by four-phase clock signals. The drive on one side is shifted by 1H from the other side, and thus, the clock signal generating portion 34 generates eight-phase clock signals V1-V8. In each of the clock signals, a pulse having a cycle of 8H and a width of 2H is generated, and clock signals which are adjacent to each other in terms of phase, that is, Vj and V(j+1) are set to have a phase difference of 1H. More specifically, clock pulses which are adjacent to each other in terms of phase overlap by 1H of a 2H period during which the clock pulses are held at an H level. The clock signal generating portion 34 has a first set of signals V1, V3, V5, and V7 and a second set of signals V2, V4, V6, and V8. In both of the sets, the signals are shifted by 2H. The clock signal generating portion 34 supplies the first set to the gate line driving circuit 14R and supplies the second set to the gate line driving circuit 14L. The unit register circuit 38 in each of the stages is correlated with one clock signal (output control clock signal) having a phase that defines the timing of an output pulse in the stage among the clock signals of the plurality of phases.

In forward shift operation of the shift register portion 32, the clock signal generating portion 34 generates clock pulses in sequence in the forward direction, that is, in the order of V1, V2, . . . , V8, V1, . . . . On the other hand, in backward shift operation, the clock signal generating portion 34 generates clock pulses in sequence in the reverse direction, that is, in the order of V8, V7, . . . , V1, V8, . . . . The clock signal generating portion 34 supplies the generated clock pulses to the respective stages of the shift register portions 32 of the gate line driving circuit 14R and the gate line driving circuit 14L, respectively. The clock signal generating portion 34 supplies clock signals in the order of V1, V3, V5, V7, V1, . . . with different phases for the respective stages as the output control clock signals to the gate line driving circuit 14R from the top stage (upper side) down to the bottom stage (lower side). With regard to the gate line driving circuit 14L, the order is set to be V2, V4, V6, V8, V2, . . . .

The trigger signal generating portion 36 generates a forward direction trigger signal VSTF at the start of a forward shift and generates a reverse direction trigger signal VSTB at the start of a backward shift. More specifically, the trigger signal generating portion 36 generates a pulse which rises to the H level in the signal VSTF at the start of a forward shift and generates a pulse which rises to the H level in the signal VSTB at the start of a backward shift.

As described above, the shift register portion 32 is constructed to include the plurality of cascaded unit register circuits 38. Each of the unit register circuits 38 outputs a pulse from an output terminal thereof. The shift register portion 32 outputs a pulse from the unit register circuits 38 in the respective stages. In the forward shift operation, the shift register portion 32 outputs a pulse in sequence from the top stage of the unit register circuits 38, while, in the backward shift operation, the shift register portion 32 outputs a pulse in sequence from the bottom stage of the unit register circuits 38.

The unit register circuits 38 in the plurality of stages which form the shift register portion 32 include main stages having output terminals that are connected to the gate signal lines 20, respectively, and dummy stages which are added to the top and the bottom of the column of the main stages and which are not connected to the gate signal lines 20. The total number of stages in the shift register portion 32 is denoted as N. The value N of the total number of stages is determined by the number of the scanning lines of the image display device 10, that is, the number of the gate signal lines 20, and the number of the top dummy stages and the bottom dummy stages. In this embodiment, two dummy stages are provided at the top of the gate line driving circuit 14 and two dummy stages are provided at the bottom of the gate line driving circuit 14. When an output of the unit register circuit 38 in a k-th stage on the gate line driving circuit 14R side is expressed as G(2k−1) (k is a natural number which satisfies 1≤k≤N), outputs G1, G3, G(2N−3), and G(2N−1) from the dummy stages are not output to the gate signal lines 20 while an output G(2λ−1) from a λth stage (λ is a natural number which satisfies 3≤λ≤N−2) which is a main stage is output to a corresponding gate signal line 20.

It is to be noted that, when an output of the unit register circuit 38 in the k-th stage on the gate line driving circuit 14L side is expressed as G(2k), outputs G2, G4, G(2N−2), and G(2N) from the dummy stages are not output to the gate signal lines 20 while an output G(2λ) from the λth stage which is a main stage is output to a corresponding gate signal line 20.

FIG. 2 illustrates connections of input/output terminals of the unit register circuits 38. It is to be noted that, for simple illustration, clock signals are denoted as, for example, V(2λ−1), where a clock signal Vζ having a phase that is expressed by a number ζ exceeding 8 means a clock signal Vξ having a phase that is expressed by a remainder ξ left when ζ is divided by 8.

FIGS. 3 to 7 are schematic circuit diagrams of the unit register circuits 38. FIG. 3, FIG. 4, FIG. 5, FIG. 6, and FIG. 7 illustrate the unit register circuits 38 in a first stage, a second stage, the λth stage, an (N−1)th stage, and an N-th stage, respectively.

Figure 5:
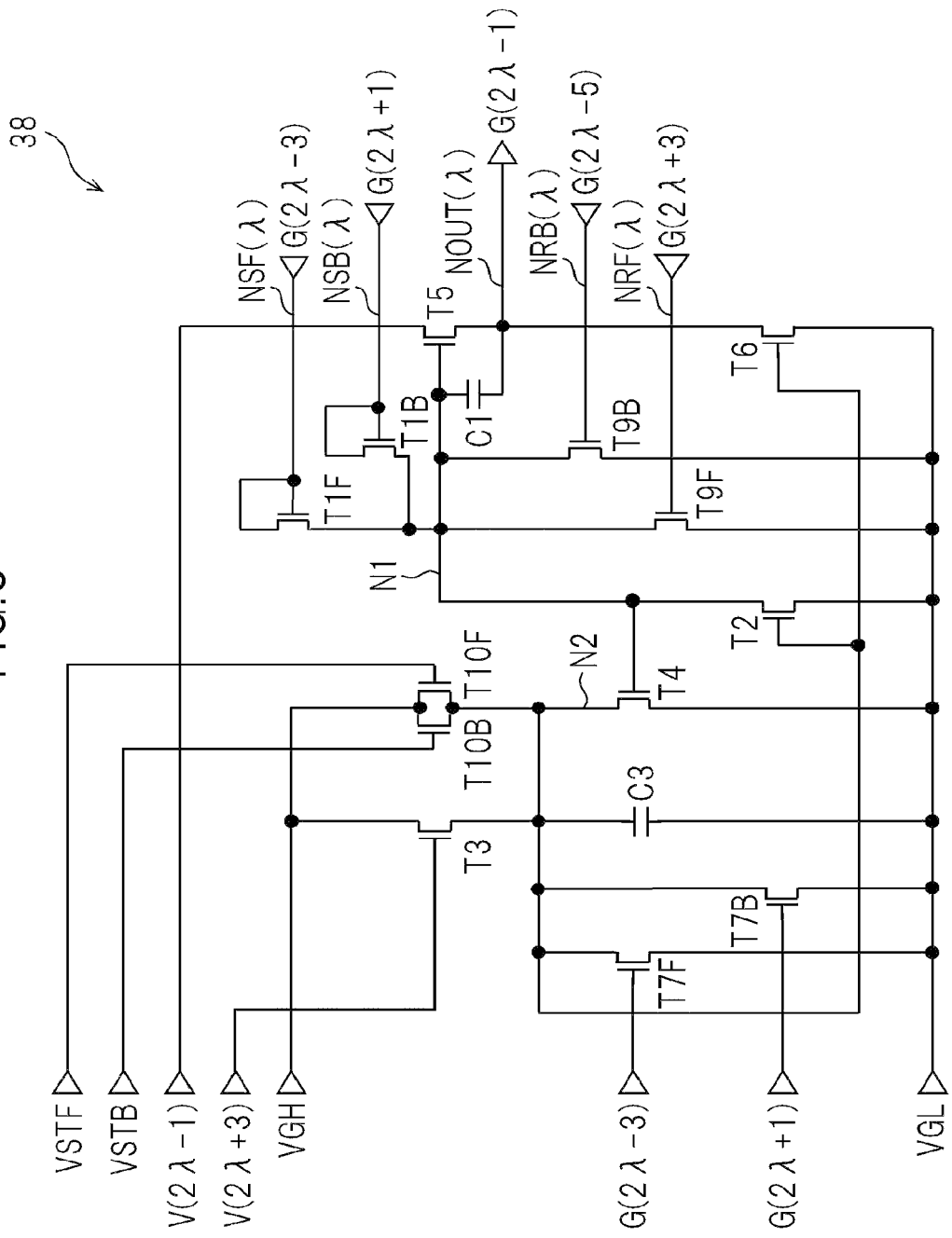
FIG. 5 is a schematic circuit diagram of a unit register circuit in a λth stage of the bidirectional shift register according to the first embodiment.

First, a structure of the unit register circuit 38 in the main stage (λth stage) illustrated in FIG. 5 is described, and then, a structure of the unit register circuits 38 in the dummy stages (k=1, 2, N−1, and N) is described mainly with reference to points different from the structure in the main stage.

The unit register circuit 38 in the λth stage includes n-channel transistors T1F, T1B, T2 to T6, T7F, T7B, T9F, T9B, T10F, and T10B and capacitors C1 and C3.

The unit register circuit 38 in the λth stage has an output terminal NOUT(λ) for outputting a pulse G(2λ−1) of its own stage. The unit register circuit 38 further has, as terminals to which a pulse in another stage is input, a forward direction set terminal NSF(λ), a reverse direction set terminal NSB(λ), a forward direction reset terminal NRF(λ), and a reverse direction reset terminal NRB(λ). An output signal G(2λ−3) is input to the terminal NSF(λ) from the (λ−1)th stage, an output signal G(2λ+1) is input to the terminal NSB(λ) from the (λ+1)th stage, an output signal G(2λ+3) is input to the terminal NRF(λ) from the (λ+2)th stage, and an output signal G(2λ−5) is input to the terminal NRB(λ) from the (λ−2)th stage.

Further, output signals V(2λ−1) and V(2λ+3) are input to the unit register circuit 38 in the λth stage from the clock signal generating portion 34.

Further, to the unit register circuits 38, the forward direction trigger signal VSTF and the reverse direction trigger signal VSTB are input from the trigger signal generating portion 36, and a voltage at the H level is supplied from a power supply VGH and a voltage at the L level is supplied from a power supply VGL.

A drain of the output transistor T5 is connected to a signal line of the output control clock signal V(2λ−1) and a source of the output transistor T5 is connected to the output terminal NOUT(λ), and the conduction of the transistor T5 is controlled according to the potential of a reference point N1 connected to a gate of the transistor T5. The capacitor C1 is connected between the gate and the source of the transistor T5. The transistor T5 and the capacitor C1 function as an output circuit which outputs the output pulse G(2λ−1) of its own stage in synchronization with the clock pulse V(2λ−1) with the node N1 as the reference point being at the H level.

Further, a drain of the transistor T6 is connected to the output terminal NOUT(λ) and a source that is connected to the power supply VGL, and on/off of the transistor T6 is controlled according to the potential of a node N2 connected to a gate of the transistor T6. The capacitor C3 is connected between the node N2 and the power supply VGL.

The reference point N1 is connected to the terminals NSF (λ) and NSB(λ) via the diode-connected transistors T1F and T1B, respectively. The transistors T1F and T1B function as a set circuit which sets the reference point N1 to the H level when an output pulse of another stage is input to the terminal NSF(λ) or NSB(λ).

The transistors T2, T9F, and T9B which are connected between the reference point N1 and the power supply VGL so as to be in parallel to one another function as switch elements which provide continuity/discontinuity between the reference point N1 and the power supply VGL. A gate of the transistor T2 is connected to the node N2, a gate of the transistor T9F is connected to the terminal NRF(λ), and a gate of the transistor T9B is connected to the terminal NRB(λ). When the potential of the node N2, the terminal NRF(λ), or the terminal NRB(λ) is at the H level, these transistors set the potential of the reference point N1 to the L level. In particular, the transistors T9F and T9B function as a reset circuit which sets the reference point N1 to the L level when an output pulse of another stage is input to the terminal NRF(λ) or NRB(λ).

Here, the node N2 is set to the H level except for a period during which the reference point N1 is set to the H level. The transistor T2 is ON during a period in which the node N2 is at the H level, and thus, the continuity is maintained for a relatively long time. As a result, a threshold voltage Vth of the transistor T2 is shifted to the positive direction, and the ability of the transistor T2 to fix the reference point N1 to the L level is lowered. On the other hand, a pulse of the clock signal V(2λ−1) is applied to the drain of the transistor T5 even outside the set period of the reference point N1 (output period of the λth stage), and the pulse has a function to pull up the potential of the reference point N1 via a gate-drain capacitance Cgd of the transistor T5. In particular, as described below, at least the size of the transistors T5 in the main stages is required to be large, and thus, the gate-drain capacitance Cgd becomes larger accordingly and the pulled-up amount of the potential of the reference point N1 becomes larger accordingly. Therefore, the transistors T9F and T9B are provided so that the reference point N1 is preferably reset to the L level.

The transistors T3, T10F, and T10B which are connected between the node N2 and the power supply VGH so as to be in parallel to one another function as switch elements which provide continuity/discontinuity between the node N2 and the power supply VGH. A gate of the transistor T3 is connected to a signal line of a clock signal (2λ+3), a gate of the transistor T10F is connected to a signal line of the forward direction trigger signal VSTF, and a gate of the transistor T10B is connected to a signal line of the reverse direction trigger signal VSTB. When the potential of the clock signal (2λ+3), the forward direction trigger signal VSTF, or the reverse direction trigger signal VSTB is at the H level, these transistors set the potential of the node N2 to the H level.

The transistors T4, T7F, and T7B which are connected between the node N2 and the power supply VGL so as to be in parallel to one another function as switch elements which provide continuity/discontinuity between the node N2 and the power supply VGL. A gate of the transistor T4 is connected to the node N1, a gate of the transistor T7F is connected to the terminal NSF(λ), and a gate of the transistor T7B is connected to the terminal NSB(λ). When the potential of the node N1, the terminal NSF(λ), or the terminal NSB(λ) is at the H level, these transistors set the potential of the node N2 to the L level.

Next, the unit register circuits 38 in the dummy stages are described. The unit register circuits 38 in the first stage and in the second stage illustrated in FIG. 3 and FIG. 4, respectively, do not have the transistor T9B, and, correspondingly to this, do not have the terminal NRB, which is described below. It is to be noted that these first and second stages have the terminals NSF, NSB, and NRF. Similarly to the case of the λth stage, a corresponding output signal in another stage is input to these terminals except the terminal NSF(1). On the other hand, no corresponding output signal in another stage exists with regard to the terminal NSF(1). The terminal NSF is provided for inputting in the forward shift operation a signal which sets the reference point N1 to the H level in preparation for generating an output pulse. To the terminal NSF(1), a pulse of the forward direction trigger signal VSTF is input from the trigger signal generating portion 36 at the start of a forward shift.

The unit register circuit 38 in the first stage is different from the unit register circuit 38 illustrated in FIG. 5 also in not having the transistor T10F.

Figure 6:
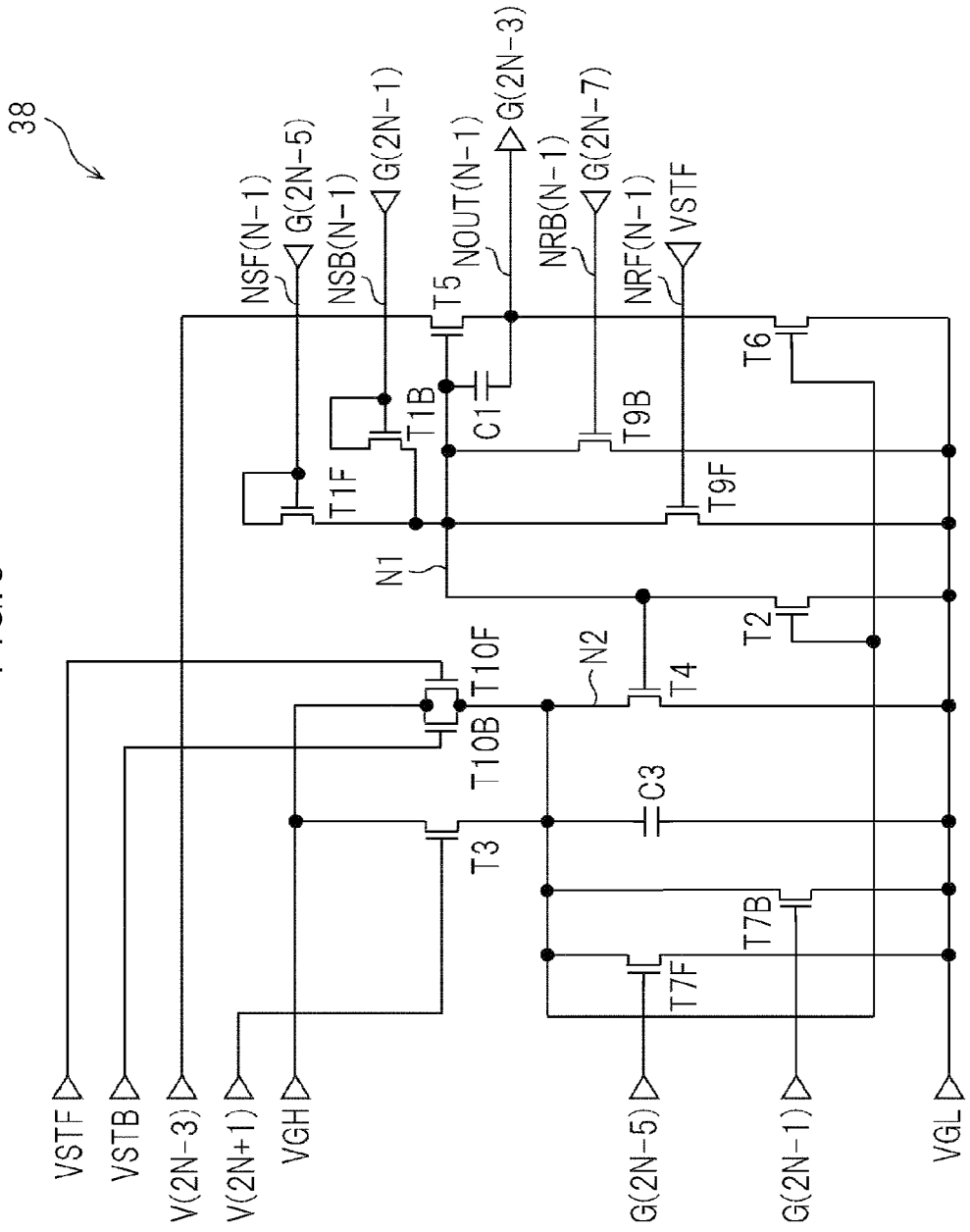
FIG. 6 is a schematic circuit diagram of a unit register circuit in an (N−1)th stage of the bidirectional shift register according to the first embodiment.
Figure 7:
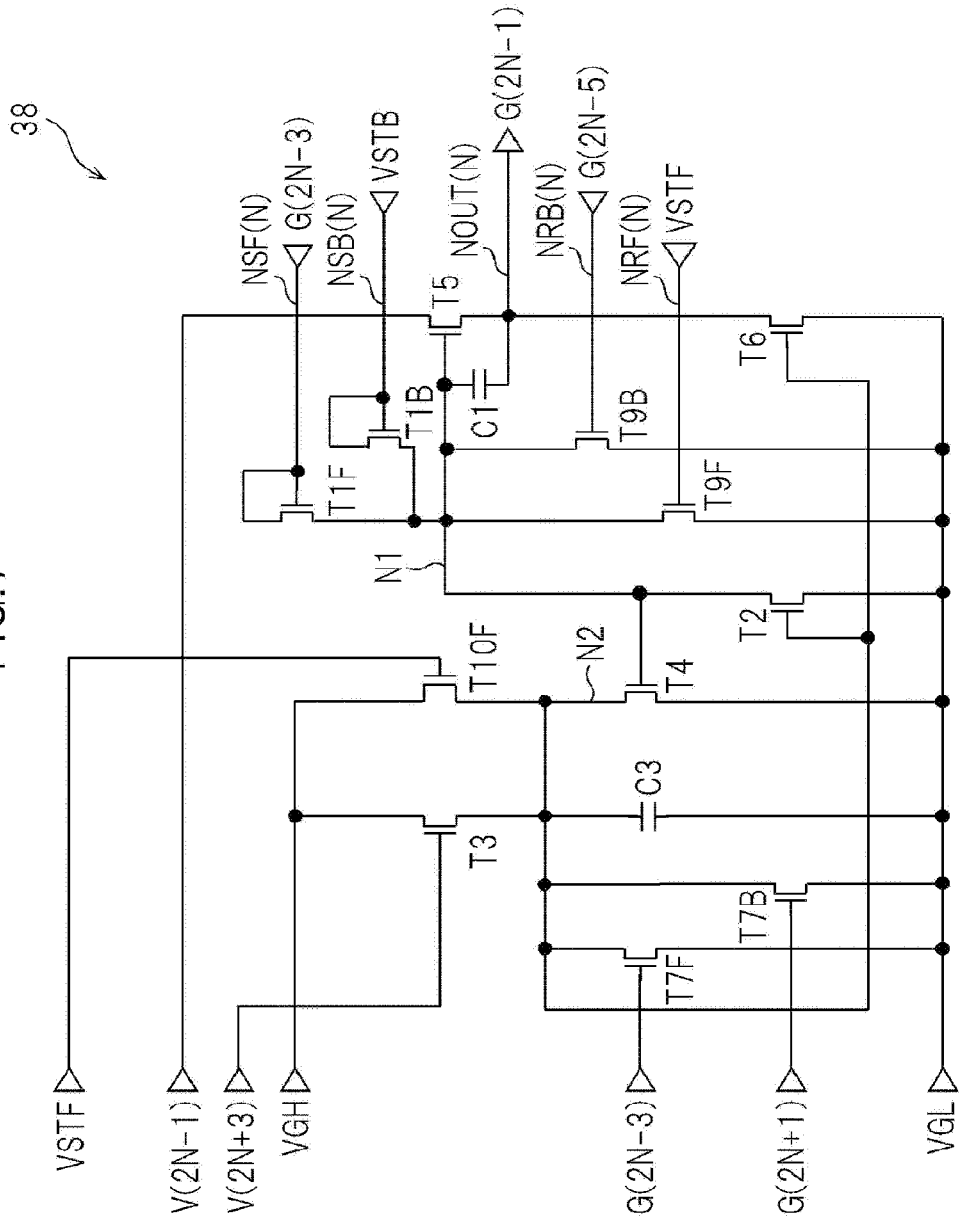
FIG. 7 is a schematic circuit diagram of a unit register circuit in an N-th stage of the bidirectional shift register according to the first embodiment.

The unit register circuits 38 in the (N−1)th stage and in the N-th stage illustrated in FIG. 6 and FIG. 7, respectively, do not have the transistor T9F, and, correspondingly to this, do not have the terminal NRF, which is described below. It is to be noted that these (N−1)th and N-th stages have the terminals NSF, NSB, and NRB, and similarly to the case of the λth stage, a corresponding output signal in another stage is input to these terminals except the terminal NSB(N). On the other hand, no corresponding output signal in another stage exists with regard to the terminal NSB(N). The terminal NSB is provided for inputting in the backward shift operation a signal which sets the reference point N1 to the H level in preparation for generating an output pulse. To the terminal NSB(N), a pulse of the reverse direction trigger signal VSTB is input from the trigger signal generating portion 36 at the start of a backward shift.

The unit register circuit 38 in the N-th stage is different from the unit register circuit 38 illustrated in FIG. 5 also in not having the transistor T10B.

The output terminal NOUT in a main stage is connected to the gate signal line 20 and to the plurality of pixel circuits 12 as loads to be driven. As the length of the gate signal line 20 increases due to a larger screen and as the number of the pixel circuits 12 connected to the gate signal line 20 increases due to higher resolution, the loads to be driven become heavier. The output transistor T5 in a main stage is required to have a driving ability corresponding to the loads, and is designed to have, for example, a large gate width (channel width). For example, the output transistor T5 in a main stage is designed to have a channel width as large as about 5,000 μm. On the other hand, dummy stages are not connected to the gate signal lines 20. Thus, the driving ability of the output transistor T5 in a dummy stage is set to be lower than that in a main stage. For example, the output transistor T5 in a dummy stage is set to have a channel width of about 500 μm, which is 1/10 of that of the output transistor T5 in a main stage. In this way, the size of the transistors T5 in the dummy stages reduces, and thus, the unit register circuits 38 in the dummy stages may be miniaturized. Further, power consumption of the dummy stages may be reduced.

In the above, the structure of the gate line driving circuits 14 is described taking as an example the gate line driving circuit 14R on the right side for driving the odd-numbered gate signal lines 20. A structure of the gate line driving circuit 14L on the left side for driving the even-numbered gate signal lines 20 is similar to that of the gate line driving circuit 14R on the right side, but is described briefly for confirmation. For example, the λth stage of the shift register portion 32 is connected to the gate signal line 20 in the (2λ−1)th row in the gate line driving circuit 14R on the right side, while the λth stage of the shift register portion 32 is connected to the gate signal line 20 in the (2λ)th row in the gate line driving circuit 14L on the left side. In a forward shift, the gate signal line 20 in the (2λ)th row is driven with the delay of 1H from the drive of the gate signal line 20 in the (2λ−1)th row. As is easily conceived from this relationship, the output terminal NOUT (k) of the unit register circuit 38 in the k-th stage (1≤k≤N) of the gate line driving circuit 14L outputs a signal G(2k), and signals G(2λ−2), G(2λ+2), G(2λ+4), and G(2λ−4) are input to the terminals NSF(λ), NSB(λ), NRF(λ), and NRB(λ), respectively, in the main stages. Further, a signal V(2k) as the output control clock signal is input to the transistor T5, and a clock signal V(2k+4) is applied to the gate of the transistor T3.

Figure 8:
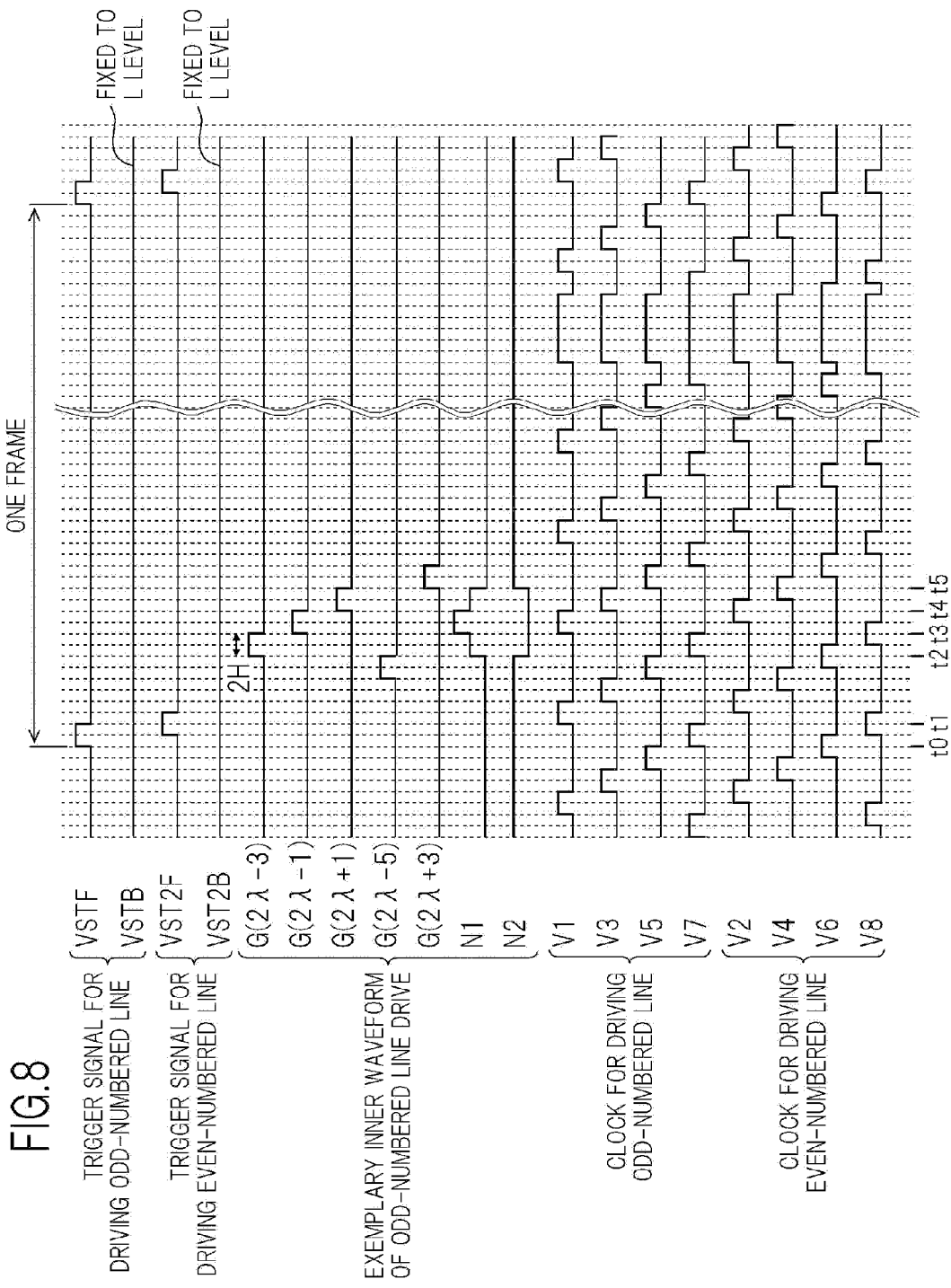
FIG. 8 is a timing diagram illustrating waveforms of various signals in forward shift operation of the bidirectional shift register according to the first embodiment.

Next, operation of the bidirectional shift register 30 is described. FIG. 8 is a timing diagram illustrating waveforms of various signals in the forward shift operation.

The forward shift starts by, at the head of image signals for one frame, generation of pulses of forward direction trigger signals by the trigger signal generating portion 36 (at times t0 and t1). The trigger signal generating portion 36 generates, after generating a pulse of the forward direction trigger signal VSTF for driving the odd-numbered lines at the time t0, a pulse of a forward direction trigger signal VSTF2 for driving the even-numbered lines at the time t1, which is delayed by 1H from t0. On the other hand, the reverse direction trigger signal VSTB for driving the odd-numbered lines and a reverse direction trigger signal VSTB2 for driving the even-numbered lines are fixed at the L level.

In the unit register circuits 38 in the second to N-th stages, when a pulse of the signal VSTF is input, the transistor T10F is turned on, the node N2 is pulled up to the H level, and, as a result, the transistor T2 is turned on to reset the reference point N1 to the L level. On the other hand, in the unit register circuits 38 in the first to (N−αb)th stages, when a pulse of the signal VSTB is input, the transistor T10B is turned on to reset the reference point N1 to the L level.

As described above, the clock signal generating portion 34 generates, in the forward shift operation, the pulses in sequence in the forward direction. More specifically, the clock signal generating portion 34 raises a pulse of a clock signal V(j+1) with a delay of 1H from a rising edge of a pulse of a clock signal Vj (j is a natural number which satisfies 1≤j≤7), and further, raises a pulse of the clock signal V1 with a delay of 1H from a rising edge of a pulse of the clock signal V8.

Here, first, forward shift operation of the unit register circuit 38 in a main stage (λth stage) in the gate line driving circuit 14R is described.

Before the operation in the λth stage, the first to (λ−1)th stages are operated in sequence to output pulses having a width of 2H with a phase difference of 2H therebetween. When a pulse of the output signal G(2λ−3) in the (λ−1)th stage is input to the terminal NSF(λ) (time t2), the reference point N1 is set to a potential (VGH-Vth (T1F)) corresponding to the H level, the transistor T5 is turned on, and the interterminal voltage of the capacitor C1 is set to the same potential. Here, the transistor T4 is turned on to set the node N2 to the L level. Further, here, the transistor T7F is also turned on, and thus, the node N2 is set to the L level faster than in a case in which only the transistor T4 is turned on. The potential of the node N2 is held in the capacitor C3. The node N2 is at the L level, and thus, the transistors T2 and T6 are in an off state.

An output pulse in the (λ−1)th stage is generated in synchronization with a pulse of a clock V(2λ−3) (in FIG. 8, a pulse of the clock V7), and thus, at a time t3 which is delayed by 2H from the time t2, a pulse of a clock signal V(2λ−1) (in FIG. 8, a pulse of the clock signal V1) is input to the λth stage. The pulse of the clock signal V(2λ−1) pulls up the potential of the source of the transistor T5. Then, the potential of the node N1 is further pulled up by the bootstrap effect, and the pulse of the clock signal V(2λ−1) becomes a pulse of the signal G(2λ−1) without lowering the potential thereof to be output from the terminal NOUT(λ). The pulse of the signal G(2λ−1) is input to the terminal NSF in the (λ+1)th stage, and sets the node N1 in that stage to the H level.

When, at a time t4, the pulse of the clock signal V(2λ−1) falls, the pulse of the signal G(2λ−1) also falls. On the other hand, the potential of the reference point N1 is held at the H level.

At the time t4, the (λ+1)th stage outputs a pulse of the signal G(2λ+1) in synchronization with a pulse of a clock signal V(2λ+1). In this way, each of the stages outputs a pulse of its own with a delay of 2H from the output of a pulse in the preceding stage. The (λ+2)th stage which receives the output of the pulse in the (λ+1)th stage outputs a pulse of the signal G(2λ+3) at a time t5 which is delayed by 2H from the time t4.

In the λth stage, when, at the time t5, the pulse of the signal G(2λ+3) is input to the terminal NRF, the transistor T9F is turned on to reset the reference point N1 to the L level. At the same time, a clock signal V(2λ+3) turns on the transistor T3 to pull up the node N2 to the H level. As a result, the transistor T6 is turned on to connect the output terminal NOUT(λ) to the power supply VGL.

It is to be noted that the transistor T3 is periodically turned on by the clock signal V(2λ+3) also at times other than the time t5, and satisfactorily holds the node N2 at the H level except for a period in which the reference point N1 is in a set state. This causes the output terminal NOUT(λ) to be held at the L level except for the period in which the reference point N1 is set to the H level.

By the above-mentioned operation, during the period of 2H which precedes the time t2, a pulse is input from the (λ−2)th stage to the terminal NRB(λ) to turn on the transistor T9B. The period is before the reference point N1 is set to the H level by the input of a pulse from the (λ−1)th stage to the terminal NSF(λ), and thus, the above-mentioned operation is not affected. Further, during the period of 2H between the times t4 and t5, a pulse is input from the (λ+1)th stage to the terminal NSB(λ), and a potential at the H level is applied from the terminal NSB(λ) via the transistor T1B to the reference point N1. The period is before the reference point N1 is reset to the L level by the input of a pulse from the (λ+2)th stage to the terminal NRF(λ), and thus, the above-mentioned operation is not affected.

Further, the timing of setting the reference point N1 to the H level is after a pulse which precedes a pulse at the time t3 by a cycle among the plurality of pulses of the clock signal V(2λ−1), and the timing of resetting the reference point N1 to the L level is before a pulse which is generated after a cycle, and therefore, a pulse is output from the terminal NOUT(λ) only once, which is in synchronization with the pulse at the time t3 among the pulses of the clock signal V(2λ−1).

As described above, a main stage receives an output pulse from the previous stage to cause the reference point N1 to be in the set state, and receives an output pulse from the stage next to the subsequent stage to cause the reference point N1 to be in the reset state. However, the dummy stage as the first stage does not have the previous stage. Therefore, as described above, the first stage has a structure in which a pulse of the forward direction trigger signal VSTF is input to the terminal NSF. The first stage receives a pulse of the signal VSTF which is generated at the time t0 to set the reference point N1 to the H level. Subsequent operation in the first stage is similar to that in the λth stage described above. The (N−1)th and N-th stages do not have the stage next to the subsequent stage. Further, in the first place, unlike the main stages, the (N−1)th and N-th stages do not have the forward direction reset terminal NRF. Therefore, the reference point N1 in the (N−1)th and N-th stages cannot be reset similarly to that in the main stages. In this embodiment, the reference point N1 in the (N−1)th and N-th stages is set to the H level at the end of the forward shift operation for one frame, and then is reset to the L level when the transistors T10F and T2 are turned on in response to a pulse of the signal VSTF which is generated at the start of the subsequent frame. It is to be noted that this point is described in detail below.

The forward shift operation of the stages in the gate line driving circuit 14R is described above. The forward shift operation of the stages in the gate line driving circuit 14L is similar to that of the corresponding stages in the gate line driving circuit 14R. However, it is to be noted that the stages in the gate line driving circuit 14L operate with a delay of 1H from the corresponding stages in the gate line driving circuit 14R, respectively.

Figure 9:
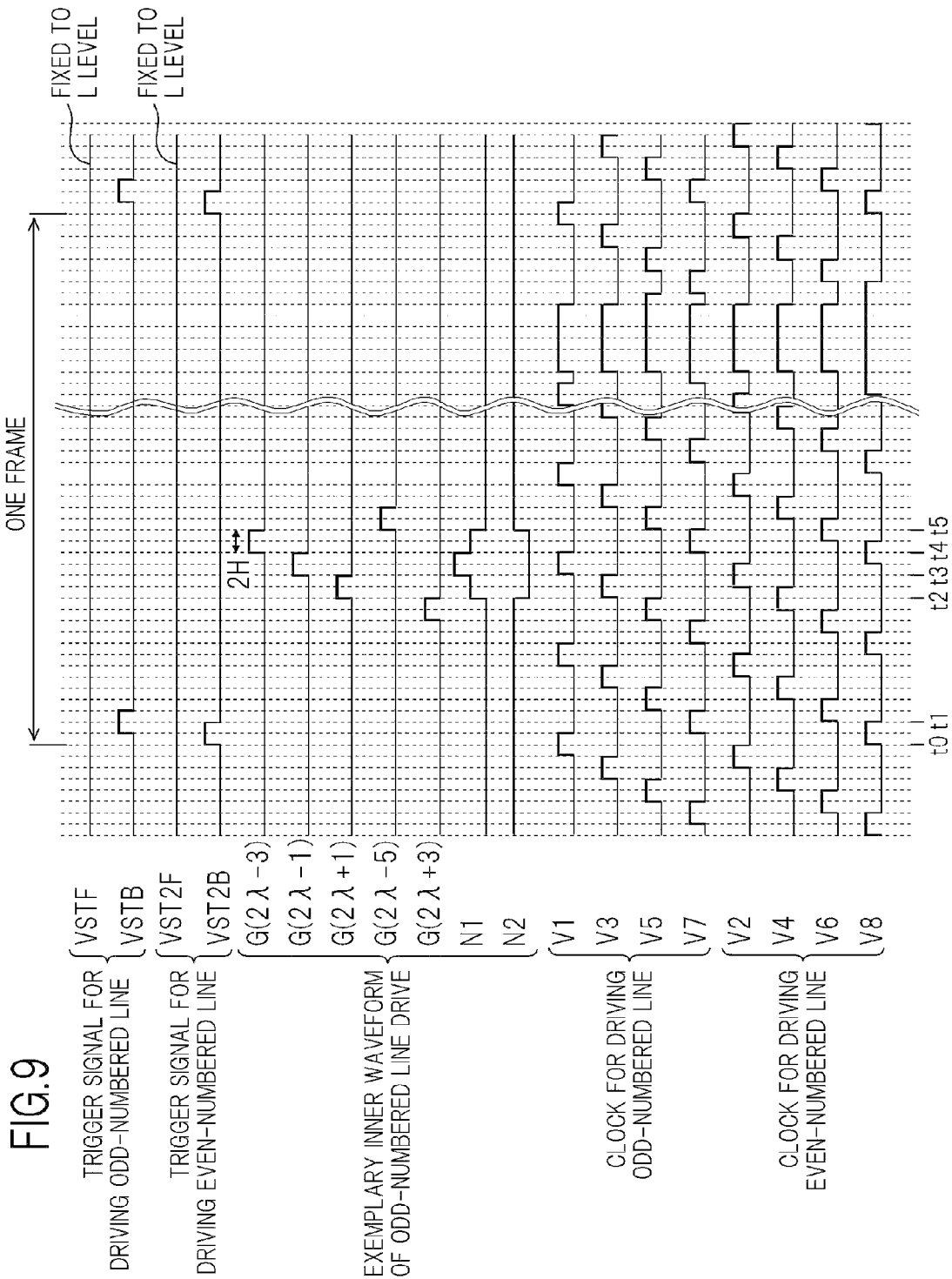
FIG. 9 is a timing diagram illustrating waveforms of various signals in backward shift operation of the bidirectional shift register according to the first embodiment.

FIG. 9 is a timing diagram illustrating waveforms of various signals in the backward shift operation.

The backward shift starts by, at the head of image signals for one frame, generation of pulses of reverse direction trigger signals by the trigger signal generating portion 36 (at times t0 and t1). The trigger signal generating portion 36 generates, after generating a pulse of the reverse direction trigger signal VSTB2 for driving the even-numbered lines at the time t0, the pulse of a reverse direction trigger signal VSTB for driving the odd-numbered lines at the time t1, which is delayed by 1H from t0. On the other hand, the forward direction trigger signal VSTF for driving the odd-numbered lines and the forward direction trigger signal VSTF2 for driving the even-numbered lines are fixed at the L level.

As described above, the clock signal generating portion 34 generates, in the backward shift operation, the pulses in sequence in the reverse direction. More specifically, the clock signal generating portion 34 raises the pulse of the clock signal Vj with a delay of 1H from a rising edge of the pulse of the clock signal V(j+1), and further, raises a pulse of the clock signal V8 with a delay of 1H from a rising edge of the pulse of the clock signal V1.

The unit register circuit 38 in each of the stages of the shift register portion 32 has a circuit structure in which a portion related to the terminal NSF and a portion related to the terminal NSB are symmetrical with each other and in which a portion related to the terminal NRF and a portion related to the terminal NRB are symmetrical with each other. More specifically, according to the four-phase clocks used for driving the gate line driving circuit 14 on one side, in both the forward shift operation and the backward shift operation, the unit register circuit 38 in each of the stages is adapted to receive at the terminal NSB an output pulse which is generated with an advance of one phase of the clock, that is, 2H, from that of its own stage to cause the reference point N1 to be in the set state, and is adapted to receive at the terminal NRB an output pulse which is generated with a delay of two phases of the clock, that is, 4H, from that of its own stage to cause the reference point N1 to be in the reset state. Further, both ends of the shift register portion 32, that is, the top dummy stages and the bottom dummy stages are in a symmetrical relationship in structure with respect to shifts in opposite directions. More specifically, the top dummy stages in the backward shift operation function similarly to the bottom dummy stages in the forward shift operation, while the bottom dummy stages in the backward shift operation function similarly to the top dummy stages in the forward shift operation. Therefore, if the control circuit 18 switches the trigger signals and switches the order of generation of the clock pulses, the shift register portion 32 performs the backward shift operation similarly to the forward shift operation.

For example, in the N-th stage in the gate line driving circuit 14R, a pulse of the reverse direction trigger signal VSTB is input to the terminal NSB at the time t1 and the reference point N1 is set to the H level. After that, in synchronization with a pulse of a clock signal V(2N−1) which is generated first, a pulse is generated in an output signal G(2N−1). In this way, pulses are output from the stages in sequence in the opposite order to that in the forward shift operation.

The backward shift operation is described in the above taking as an example the gate line driving circuit 14R. The backward shift operation of each of the stages in the gate line driving circuit 14L is similar to that of the corresponding stage in the gate line driving circuit 14R. However, each of the stages in the gate line driving circuit 14L performs operation with an advance of 1H from the corresponding stage in the gate line driving circuit 14R.

Here, with its own stage being a starting point, another stage which inputs a pulse to the reset terminal NRF is set to be a stage which is farther than still another stage that inputs a pulse to the set terminal NSB, and, another stage which inputs a pulse to the reset terminal NRB is set to be a stage which is farther than still another stage that inputs a pulse to the set terminal NSF. In this structure, in the forward shift operation, the pulses which are input to the terminals NSB and NRB that are related to the backward shift operation do not affect the forward shift operation, and, similarly, in the backward shift operation, the pulses which are input to the terminals NSF and NRF that are related to the forward shift operation do not affect the backward shift operation. Therefore, for example, it is not necessary to provide a switch for selectively accepting the inputs to the terminals NSF and NRF in the forward shift operation and selectively accepting the inputs to the terminals NSB and NRB in the backward shift operation. More specifically, the shift register portion 32 and the unit register circuits 38 therein may have a basic circuit structure which is not switched between one for the forward shift and one for the backward shift. A transistor used as the switch is not necessary, and thus, the circuit structure of the unit register circuit 38 becomes simpler accordingly, which makes it easier to miniaturize the unit register circuit 38. Further, a signal line for supplying a switching signal to the transistor concerned in each of the stages is not required to be arranged along the shift register portion 32, and thus, the size increase in a horizontal direction of the gate line driving circuits 14 may be suppressed.

It is to be noted that, as described in the description of the forward shift operation, in synchronization with the operation of resetting the reference point N1, a clock signal is used to turn on the transistor T3 and the node N2 is pulled up to the H level. In this embodiment, clocks for driving a gate line driving circuit 14 on one side are four-phase clocks, and, for example, in the gate line driving circuit 14R, the reference point N1 is reset to a timing which is delayed by two phases of the clock from the output control clock signal V(2k−1) to the output transistor T5 in its own stage. The clock signal which turns on the transistor T3 at the timing of resetting the reference point N1 is V(2k+3) in the forward shift and V(2k−5) in the backward shift, which are a common clock signal. This means that, in this embodiment, a clock signal for controlling the transistor T3 is also not required to be switched between one for the forward shift and one for the backward shift.

In the above-mentioned embodiment, the top dummy stages do not have the reverse direction reset terminal NRB and the transistor T9B, and the bottom dummy stages do not have the forward direction reset terminal NRF and the transistor T9F. This structure is described. The reset terminals NRF and NRB are used for inputting a signal which resets the reference point N1 to the L level after an output pulse is generated. By resetting the reference point N1 to the L level, an output pulse is prevented from being generated by a pulse of an output control clock signal which is input thereafter. Here, outputs of the first, second, (N−1)th, and N-th stages, which are dummy stages, are not used for driving the gate signal lines 20. Further, outputs of the (N−1)th and N-th stages, which are dummy stages that operate after output pulses in the main stages are generated in a forward shift, and outputs of the first and second stages, which are dummy stages that operate after output pulses in the main stages are generated in a backward shift, are not used as signals for setting the reference point N1 in another stage. Therefore, these dummy stages which operate at the end of each shift operation do not present any specific problem even if the dummy stages repeatedly generate the output pulses according to repetition of clock pulses. Therefore, it is sufficient that the reference point N1 in the dummy stages is caused to be in the reset state before the start of shift operation with regard to the subsequent frame. For this reason, in this embodiment, as described in the description of the forward shift operation, the reference point N1 in the (N−1)th and N-th stages is reset by turning on the transistors T10F and T2 in response to a pulse of the signal VSTF which is generated at the start of the subsequent frame. Further, similarly, in the backward shift operation, the reference point N1 in the first and second stages is reset by turning on the transistors T10B and T2 in response to a pulse of the signal VSTB which is generated at the start of the subsequent frame.

It is to be noted that, as described above, the transistors T9F and T9B are primarily provided for the purpose of compensating for the lowered resetting ability of the transistor T2. However, in the dummy stages, the size of the transistor T5 is smaller than that in the main stages and the capacitance Cgd is also smaller than that in the main stages, and thus, the pulled-up amount of the potential of the reference point N1 described above is smaller than that in the main stages. Therefore, in the dummy stages, the reset may be performed only by the transistor T2 without the assistance of the transistors T9F and T9B.

Now, consider a structure in which the reverse direction reset terminal NRB and the transistor T9B are added to the unit register circuit 38 in the top dummy stages as means for resetting the reference point N1 in the backward shift operation and the forward direction reset terminal NRF and the transistor T9F are added to the unit register circuit 38 in the bottom dummy stages as means for resetting the reference point N1 in the forward shift operation. In this case, it is not preferred to additionally generate signals to be applied to the added reset terminals NRF and NRB because, for example, the size of the control circuit 18 and the like increases. In this regard, the circuit size does not increase in the structure in which the reverse direction trigger signal VSTB is input to the terminal NRB added to the top dummy stages and the forward direction trigger signal VSTF is input to the terminal NRF added to the bottom dummy stages. In this structure, in the forward shift operation, the potential of the reference point N1 in the bottom dummy stages is reset by a pulse of the signal VSTF simultaneously with the start of the subsequent frame, and, in the backward shift operation, the potential of the reference point N1 in the top dummy stages is reset by a pulse of the signal VSTB simultaneously with the start of the subsequent frame, to thereby materialize operation of a bidirectional shift register.

However, this structure may cause the following problem. In this structure, the reverse direction trigger signal VSTB is fixed to the L level in the forward shift operation, and the forward direction trigger signal VSTF is fixed to the L level in the backward shift operation, and thus, the transistor T9B in the first and second stages is held in the off state in the forward shift operation and the transistor T9F in the (N−1)th and N-th stages is held in the off state in the backward shift operation. Such a transistor in which the drain and the source are applied with a voltage and which is held in the off state for a long time may have a change in transistor characteristics called Vth shift. More specifically, in an n-channel transistor, the threshold voltage Vth is liable to be lowered and a leakage current is liable to occur. The Vth shift is particularly liable to occur in an a-Si thin film transistor (TFT). When the transistor T9F or T9B causes a leakage current, the potential of the reference point N1 is lowered in an output period in which the reference point N1 should be at the H level, and hence output pulses are not generated. More specifically, in the forward shift operation, the transistor T9B in the top dummy stages may cause a leakage current and output pulses may not be generated, and, in the backward shift operation, the transistor T9F in the bottom dummy stages may cause a leakage current and output pulses may not be generated. Thus, an inconvenience that the shift operation cannot be continued may occur. Taking this into consideration, in the present invention, the reverse direction reset terminal NRB and the transistor T9B are not provided in the top dummy stages and the forward direction reset terminal NRF and the transistor T9F are not provided in the bottom dummy stages.

By the way, in the embodiment described above, a gate line driving circuit 14 on one side is driven by four-phase clock signals, and, basically, outputs of the (k−2)th stage, the (k−1)th stage, the (k+1)th stage, and the (k+2)th stage are input to the unit register circuit 38 in the k-th stage so that the reference point N1 is set to the H level by output pulses in (k−1)th stage and the (k+1)th stage and that the reference point N1 is reset to the L level by output pulses in the (k−2)th stage and the (k+2)th stage. Such a structure materializes a bidirectional shift register which does not basically require switch between a circuit structure for the forward shift and a circuit structure for the backward shift. Further, in such a structure, after an output pulse of each of the stages falls, the reference point N1 is reset from the H level to the L level. More specifically, after an output pulse of each of the stages ends, a subsequent set period in which the reference point N1 in the stage is held in the set state is provided. By the existence of the subsequent set period, operation of the bidirectional shift register according to the present invention is not operation in which the potential of the reference point N1 is abruptly pulled down from a potential higher than the H level to the L level and the transistor M6 is turned on, and thus, unstable operation due to timing misalignment and deformation of the waveform of each of the signals such as a through current is less liable to occur.

Here, the present invention is not limited to the structure of the above-mentioned embodiment. A generalized structure of the bidirectional shift register according to the present invention is as follows. It is assumed that the shift register portion 32 is driven by n-phase clock signals (n is an integer which is equal to or larger than 3), and $\alpha f$, $\alpha b$, $\beta f$, and $\beta b$ are natural numbers which satisfy both $\alpha f < \beta b < n$ and $\alpha b < \beta f < n$. Then, outputs of a (k−$\beta b$)th stage, a (k−$\alpha f$)th stage, a (k+$\alpha b$)th stage, and a (k+$\beta f$)th stage are input to the unit register circuit 38 in the k-th stage so that the reference point N1 is set to the H level by output pulses in the (k−$\alpha f$)th stage and the (k+$\alpha b$)th stage and that the reference point N1 is reset to the L level by output pulses in the (k−$\beta b$)th stage and the (k+$\beta f$)th stage. Such a structure also materializes a bidirectional shift register which does not basically require switch between circuit structures with the improved stability of operation.

It is to be noted that, because $\alpha f < \beta b$ and $\alpha b < \beta f$, it follows that both $\beta f$ and $\beta b$ are equal to or larger than 2, and further, at least two main stages are necessary for the forward shift and the backward shift. It follows that the total number N of stages in the bidirectional shift register is equal to or larger than 6.

In the top $\beta b$ stages among the N stages, a reset signal in the backward shift operation cannot be obtained from an output in another stage, and, in the bottom $\beta f$ stages, a reset signal in the forward shift operation cannot be obtained from an output in another stage. Therefore, these top $\beta b$ stages and bottom $\beta f$ stages are set to be dummy stages. The top dummy stages do not include the reverse direction reset terminal NRB and the reset circuit controlled by the terminal NRB (the transistor T9B in the above-mentioned embodiment), and the bottom dummy stages do not include the forward direction reset terminal NRF and the reset circuit controlled by the terminal NRF (the transistor T9F in the above-mentioned embodiment).

In some cases, similarly to the case of the dummy stages in the above-mentioned embodiment, a signal as an alternative to an output pulse in another stage is also input to the terminal NSF, NSB, NRF, or NRB of the unit register circuits 38 in the dummy stages of the generalized shift register portion 32. More specifically, with regard to a bidirectional shift register having N stages, in the unit register circuits 38 in the first to $\alpha f$-th stages, the forward direction trigger signal is input to the terminal NSF, and the signal sets the reference point N1 to the H level at the start of the forward shift. Further, in the unit register circuits 38 in the (N−$\alpha f$+1)th to N-th stages, the reverse direction trigger signal is input to the terminal NSB, and the signal causes the reference point N1 to be in the set state at the start of the backward shift.

The basic structure of the unit register circuit 38 may include the transistors T10F and T2 as a circuit for setting the reference point N1 to the L level as an initial setting by a pulse of the forward direction trigger signal VSTF. However, as described above, in the first to $\alpha f$-th stages, a pulse of the signal VSTF is used for setting the reference point N1 to the H level. Therefore, in the unit register circuits 38 in the first to $\alpha f$-th stages, the circuit structure does not have the transistor T10F similarly to the case of the first stage in the above-mentioned embodiment (see FIG. 3) so that the reference point N1 is not reset to the L level. Similarly, the basic structure of the unit register circuit 38 may include the transistors T10B and T2 as a circuit for setting the reference point N1 to the L level as the initial setting by a pulse of the reverse direction trigger signal VSTB. However, as described above, in the (N−$\alpha b$+1)th to N-th stages, a pulse of the signal VSTB is used for setting N1 to the H level. Therefore, in the unit register circuits 38 in the (N−$\alpha b$+1)th to N-th stages, the circuit structure does not have the transistor T10B similarly to the case of the N-th stage in the above-mentioned embodiment (see FIG. 7) so that the reference point N1 is not reset to the L level.

$\alpha f$ corresponds to a period from when the reference point N1 is set to when an output pulse rises (preceding set period) in the forward shift operation while $\alpha b$ corresponds to the preceding set period in the backward shift operation. When the preceding set period becomes long, the potential of the reference point N1 held by the capacitor C1 may be lowered by a leakage current of the transistor T9F or T9B or the like, which may result in an inconvenience that, when a clock pulse is input to the drain of the transistor T5, the potential of the gate of the transistor T5 is not high enough to output a pulse from the terminal NOUT. Therefore, when there is concern about the above-mentioned inconvenience, for example, when the capacitance of the capacitor C1 is not so large, it is preferred that, as in the above-mentioned embodiment, αf and αb be set to 1 to make short the preceding set period.

Further, from the viewpoint of symmetry between operation of the image display device 10 in the forward shift operation and that in the backward shift operation, it is preferred that αf=αb and βf=βb be satisfied.

In the above-mentioned embodiment where n=4 and βf=βb=2, as described above, a clock signal used for controlling the transistor T3 may be common between the forward shift operation and the backward shift operation. Such a structure in which a clock signal for controlling the transistor T3 is common to the two directions is materialized when βf+βb=n.

The unit register circuits are not limited to the ones illustrated in FIGS. 3 to 7. More specifically, in the main stages, the unit register circuits may have another circuit structure which includes the forward direction set terminal NSF and the reverse direction set terminal NSB, the forward direction reset terminal NRF and the reverse direction reset terminal NRB, a set circuit for setting the potential of a reference point to a first potential when a set signal is input to the terminal NSF or the terminal NSB, a reset circuit for setting the potential of the reference point to a second potential when a reset signal is input to the terminal NRF or the terminal NRB, and an output circuit for outputting a pulse to an output signal in synchronization with a clock pulse which is input to the unit register circuit with the reference point being at the first potential. Further, the top dummy stages may have another circuit structure which includes, among the components in the above-mentioned structure in the main stages, the components except the reverse direction reset terminal NRB, and the bottom dummy stages may have another circuit structure which includes, among the components in the structure in the main stages, the components except the forward direction reset terminal NRF.

For example, a unit register circuit 60 in a second embodiment described below is an example of such a circuit structure. Further, when the above-mentioned condition for controlling the transistor T3 by a clock signal common between the forward shift and the backward shift (βf+βb=n) is not satisfied, a circuit structure may be adopted in which a control signal to be applied to the gate of the transistor T3 is switched between one for the forward shift and one for the backward shift, and this is one modification of the unit register circuit. Further, in the above-mentioned structure, the transistors T9F and T9B, which are switches that provide continuity/discontinuity between the reference point N1 and the power supply VGL and function as a reset circuit for setting the reference point N1 to the L level, are provided in their simplest form in which the drains thereof are directly connected to the reference point N1 and the sources thereof are directly connected to the power supply VGL. However, the transistors T9F and T9B which provide continuity/discontinuity between the reference point N1 and the power supply VGL may be a part of the switch circuit including a plurality of elements. In this structure, also, the transistor T9B in the top dummy stages and the transistor T9F in the bottom dummy stages may be eliminated to prevent a Vth shift. Further, a problem which arises due to the difference between a reset operation in the dummy stages in which a pulse is output at the end of the shift operation and a reset operation in the main stages is not limited to the one described above. In a bidirectional shift register in which the reset circuit has a problem other than the above-mentioned one, such a problem may also be avoided by applying the structure according to the present invention.

It is to be noted that, in the above-mentioned embodiment, a case is described in which a pulse of a clock signal which drives a gate line driving circuit 14 on one side does not overlap another pulse in an adjacent phase. However, the present invention may also be applied to a case in which a pulse of a clock signal overlaps another pulse in an adjacent phase. In that case, it is necessary that a set signal to the terminal NSF or NSB and a reset signal to the terminal NRF or NRB do not overlap when being input. More specifically, it is necessary that an output pulse in the (k−βb)th stage and an output pulse in the (k−αf)th stage do not overlap each other and an output pulse in the (k+αb)th stage and an output pulse in the (k+βf)th stage do not overlap each other. By this, the following condition of αf, αb, βf, and βb is obtained:

$$\alpha f + \kappa \leq \beta b < n \text{ and } \alpha b + \kappa \leq \beta f < n,$$

where κ is the width of a clock pulse (κ≥1) when, for example, the phase difference between the clock signals Vj and V(j+1) is 1.

A case in which an n-channel transistor is used as a transistor that forms the bidirectional shift register 30 according to the present invention is described above, but the transistor may be a p-channel one. Further, the transistor may be TFT or may be MOSFET. A semiconductor layer which forms the transistor basically may be any one of monocrystalline silicon, amorphous silicon (a-Si), and polycrystalline silicon (poly-Si), and may also be an oxide semiconductor such as indium gallium zinc oxide (IGZO).

Further, in the embodiment described above, the odd-numbered gate signal lines 20 are connected to the gate line driving circuit 14R, the even-numbered gate signal lines 20 are connected to the gate line driving circuit 14L, and their respective bidirectional shift registers 30 are driven each in a cycle of 2H with a phase difference of 1H therebetween. On the other hand, the present invention may also be applied to a structure in which the odd-numbered and even-numbered gate signal lines 20 are connected to the gate line driving circuits 14 and one bidirectional shift register 30 outputs pulses in sequence to the odd-numbered and even-numbered gate signal lines 20 in a cycle of 1H.

Second Embodiment

In the following, like reference numerals are used to denote members similar to those in the above-mentioned first embodiment and description thereof is omitted for the sake of simplicity of description.

A schematic structure of an image display device 10 according to a second embodiment is similar to that of the first embodiment described with reference to FIG. 1. The gate line driving circuit 14R drives odd-numbered lines while the gate line driving circuit 14L drives even-numbered lines.

Figure 10:
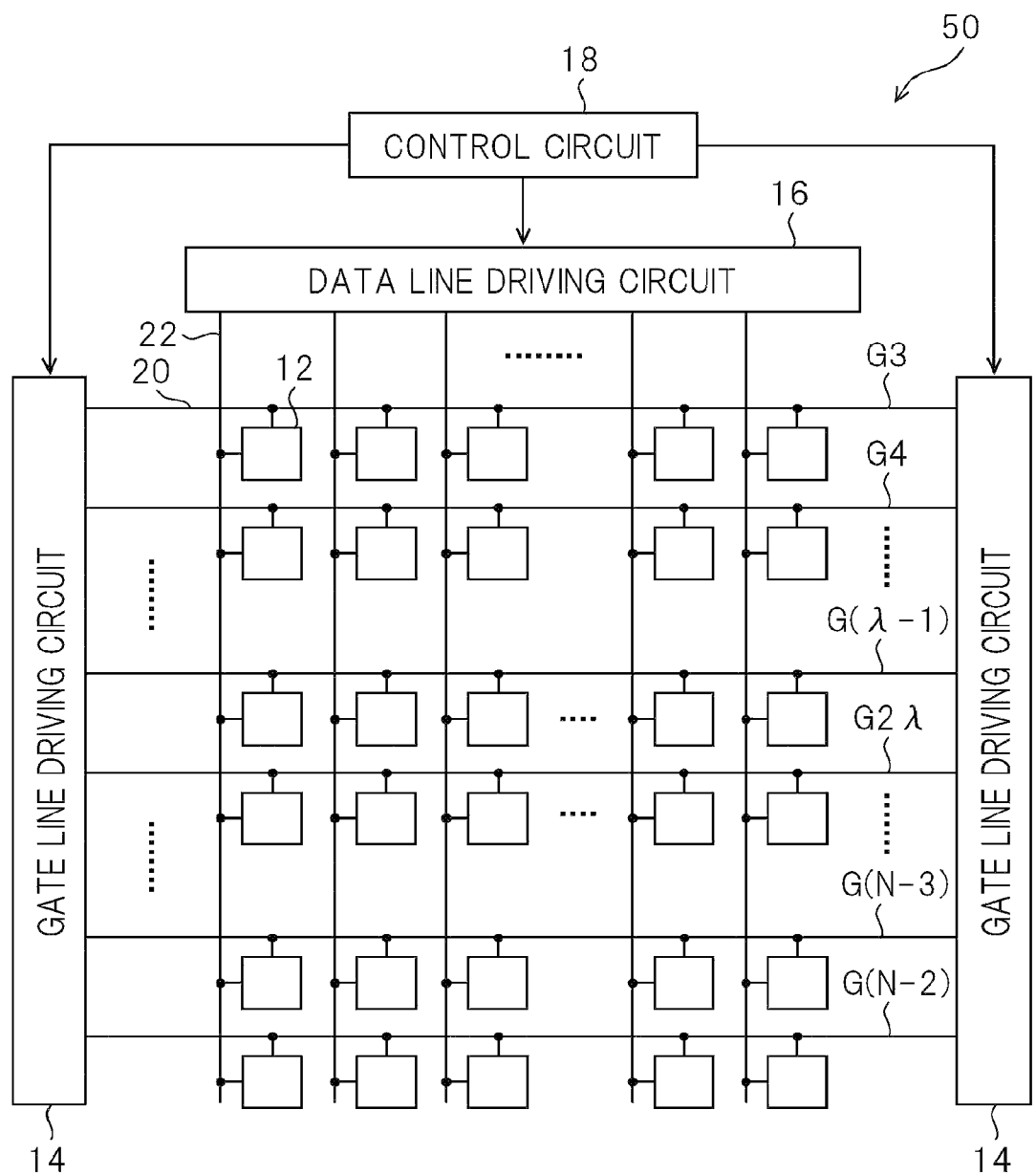
FIG. 10 is a schematic diagram illustrating a structure of a bidirectional shift register according to a second embodiment.

FIG. 10 illustrates by way of example a structure of a portion which relates to the shift register portion 32 provided in the gate line driving circuit 14R on the right side. N unit register circuits 60 are cascaded in the shift register portion 32. The number of the main stages is N−4 and two dummy stages are provided at the top before the main stages and two dummy stages are provided at the bottom after the main stages. As described below, the unit register circuit 60 in this embodiment has a circuit structure which is different from that of the unit register circuit 38 in the first embodiment in that a clock signal and a control signal to be input to each of the stages are different from those in the first embodiment illustrated in FIG. 2. However, outputs of the stages and the way of cascading the stages are basically similar to those in the first embodiment.

The clock signal generating portion 34 is similar to that in the first embodiment. The eight-phase clock signals V1 to V8 are divided into two sets of four-phase clock signals. Among them, the group of V1, V3, V5, and V7 is supplied to the gate line driving circuit 14R. All of V1, V3, V5, and V7 are input to each of the unit register circuits 60. One clock signal among them which is used as the output control clock signal is determined according to the location of the unit register circuit 60 in the shift register portion 32.

Figure 11:
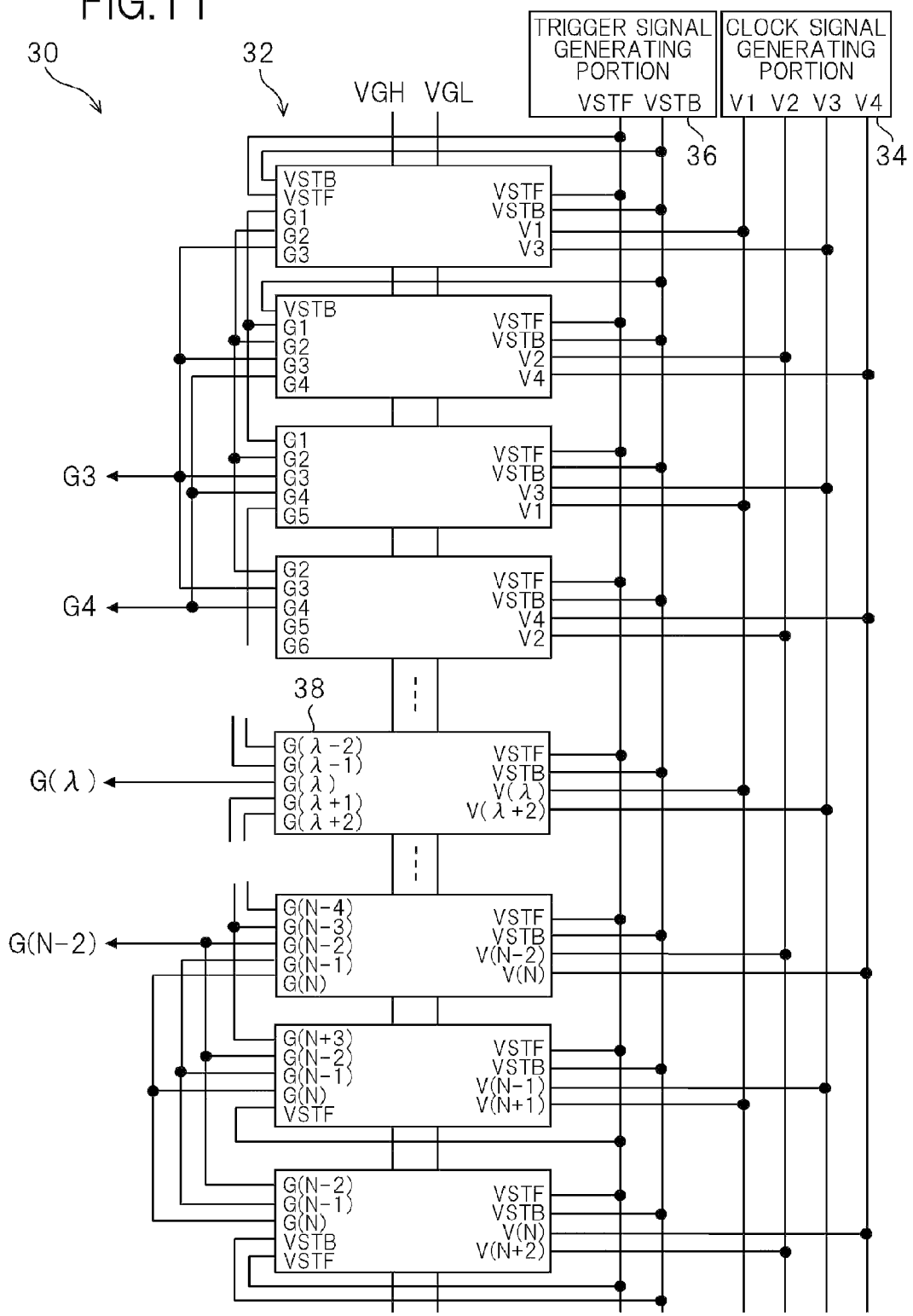
FIG. 11 is a schematic circuit diagram of a unit register circuit in a first stage and a second stage of the bidirectional shift register according to the second embodiment.
Figure 12:
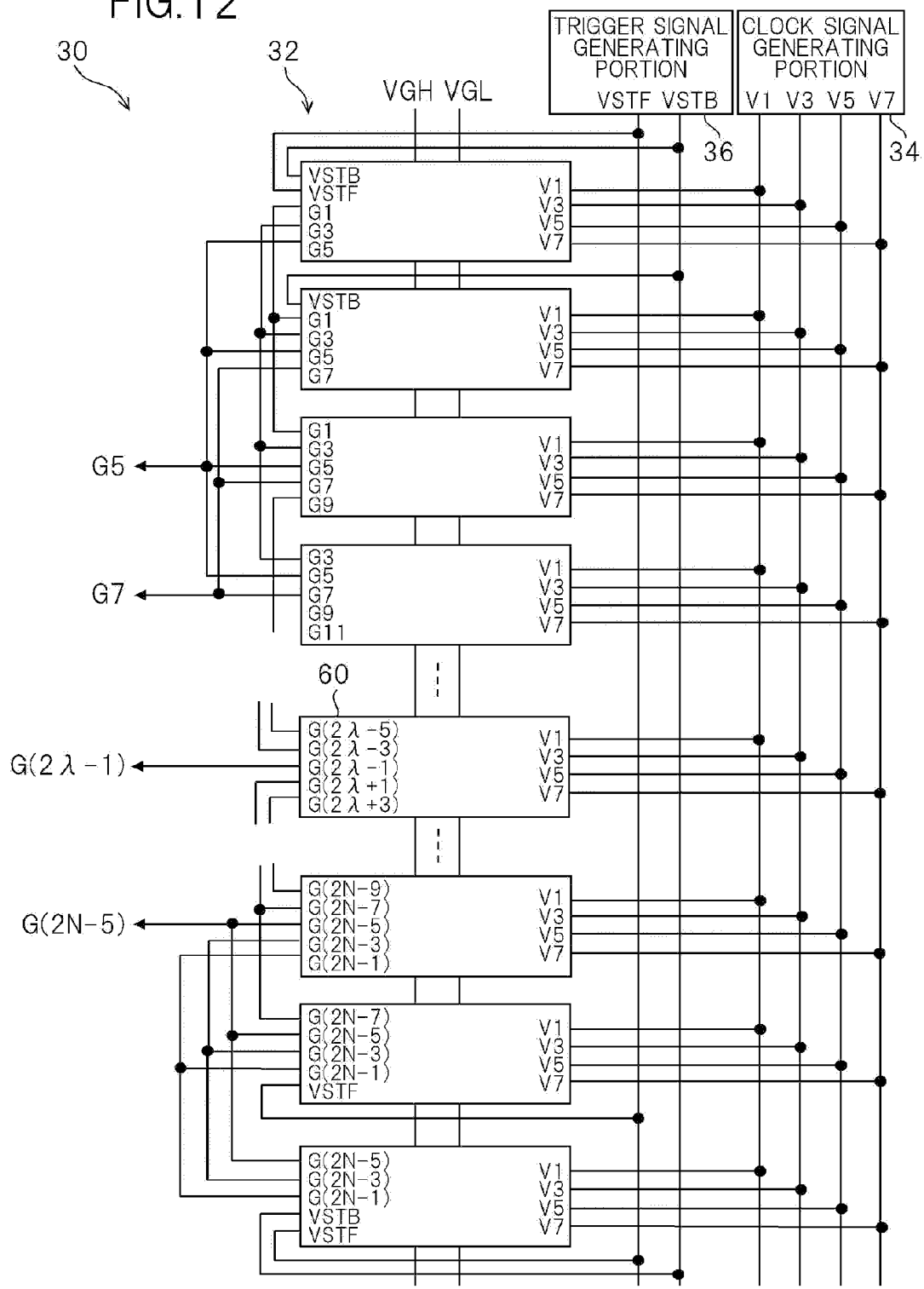
FIG. 12 is a schematic circuit diagram of a unit register circuit in a λth stage of the bidirectional shift register according to the second embodiment.
Figure 13:
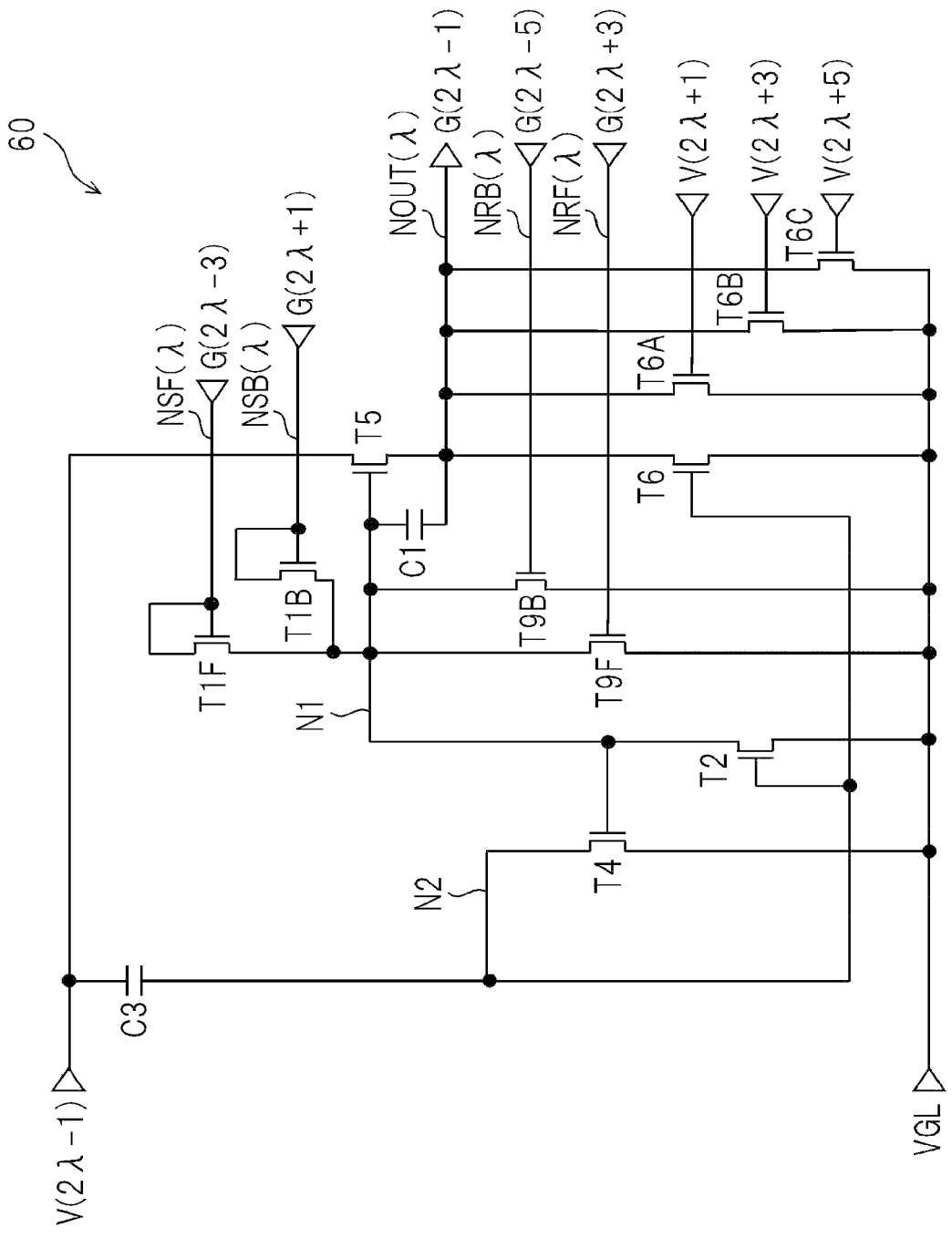
FIG. 13 is a schematic circuit diagram of a unit register circuit in an (N−1)th stage and an N-th stage of the bidirectional shift register according to the second embodiment.
Figure 14:
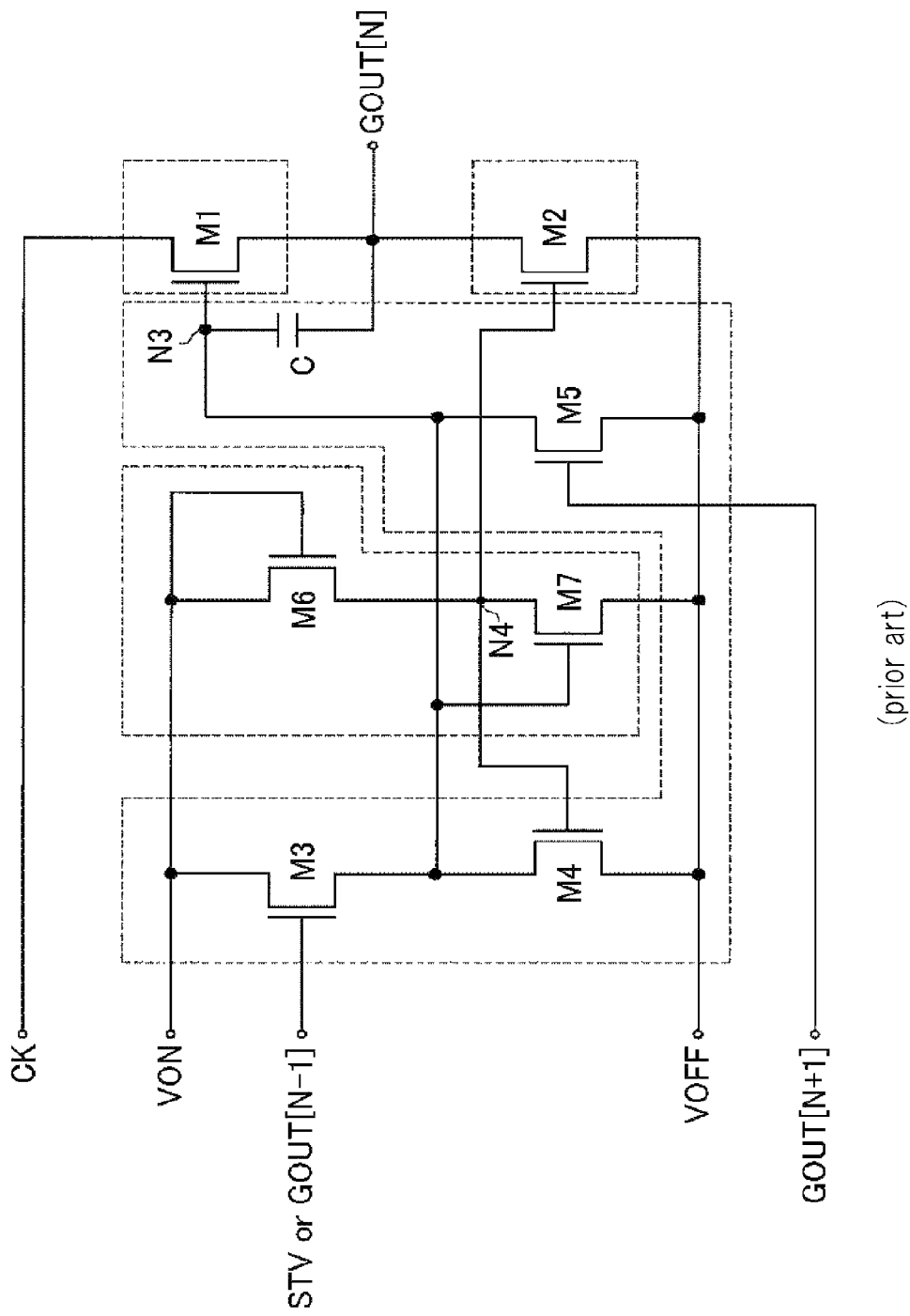
FIG. 14 is a circuit diagram illustrating a structure of a conventional unit register circuit.
Figure 15:
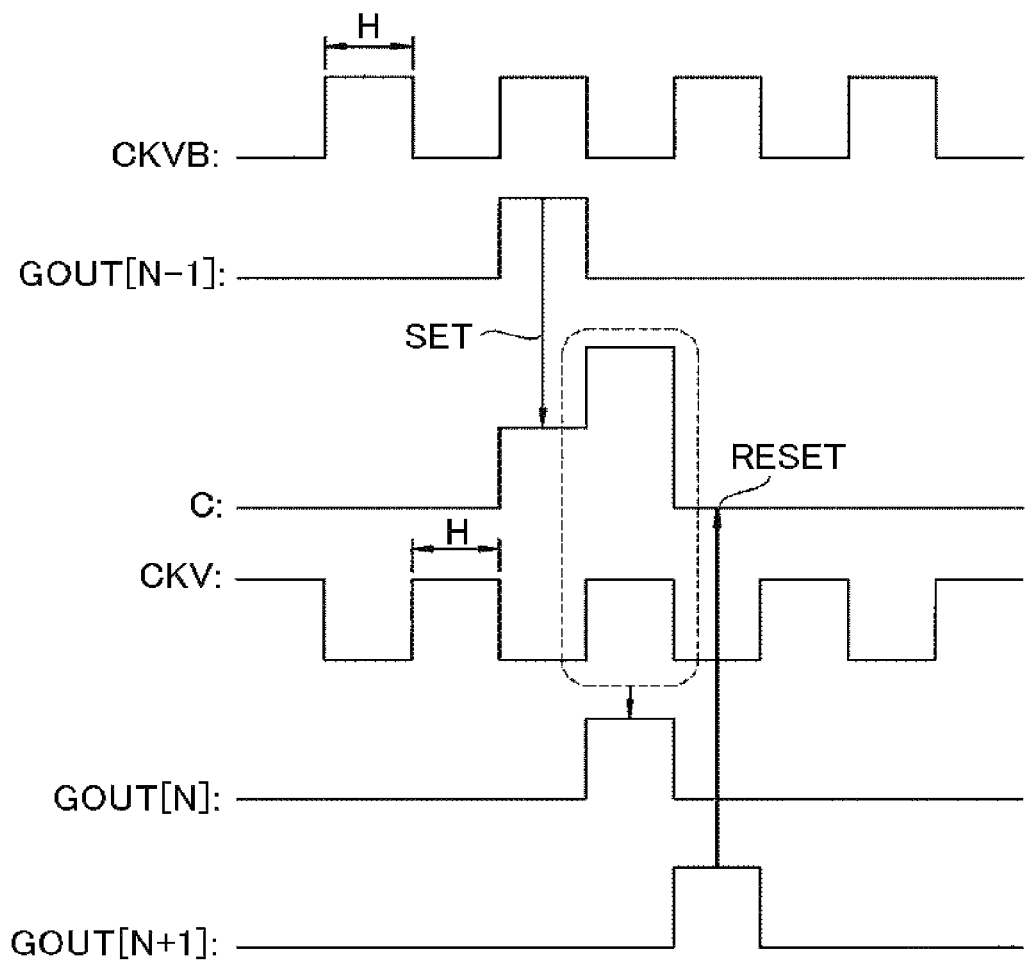
FIG. 15 is a signal waveform chart illustrating operation of the conventional unit register circuit.

FIGS. 11 and 13 are schematic circuit diagrams of the unit register circuit 60. FIG. 11 illustrates the unit register circuit 60 in a top dummy stage, FIG. 12 illustrates the unit register circuit 60 in a main stage (λth stage), and FIG. 13 illustrates the unit register circuit 60 in a bottom dummy stage.

First, a structure of the unit register circuit 60 in the main stage (λth stage) illustrated in FIG. 12 is described, and then, a structure of the unit register circuits 38 in the dummy stages (k=1, 2, N−1, and N) is described mainly with reference to points different from the structure in the main stage.

The unit register circuit 60 in the λth stage includes NMOS transistors T1F, T1B, T2, T4 to T6, T6A, T6B, T6C, T9F, and T9B and capacitors C1 and C3.

The unit register circuit 60 in the λth stage has an output terminal NOUT(λ) for outputting a pulse G(2λ−1) of its own stage. The unit register circuit 60 in the λth stage further has, as terminals to which a pulse in another stage is input, a forward direction set terminal NSF(λ), a reverse direction set terminal NSB(λ), a forward direction reset terminal NRF(λ), and a reverse direction reset terminal NRB(λ). An output signal G(2λ−3) is input to the terminal NSF(λ) from the (λ−1)th stage, an output signal G(2λ+1) is input to the terminal NSB(λ) from the (λ+1)th stage, an output signal G(2λ+3) is input to the terminal NRF(λ) from the (λ+2)th stage, and an output signal G(2λ−5) is input to the terminal NRB(λ) from the (λ−2)th stage.

Further, output signals V(2λ−1), V(2λ+1), V(2λ+3), and V(2λ+5) are input to the unit register circuit 60 in the λth stage from the clock signal generating portion 34. Further, to the unit register circuits 60, a voltage at the H level is supplied from a power supply VGH and a voltage at the L level is supplied from a power supply VGL.

A drain of the output transistor T5 is connected to a signal line of the clock signal V(2λ−1) and a source of the output transistor T5 is connected to the output terminal NOUT(λ), and the conduction of the transistor T5 is controlled according to the potential of a reference point N1 connected to a gate of the transistor T5. The capacitor C1 is connected between the gate and the source of the transistor T5. The transistor T5 and the capacitor C1 function as an output circuit which outputs the output pulse G(2λ−1) of its own stage in synchronization with the clock pulse V(2λ−1) with the reference point N1 being at the H level.

Drains of the transistors T6, T6A, T6B, and T6C are connected to the output terminal NOUT(λ) and sources of the transistors T6, T6A, T6B, and T6C are connected to the power supply VGL. A gate of the transistor T6 is connected to the node N2. A clock signal V(2λ+1) is applied to a gate of the transistor T6A. The clock signal V(2λ+3) is applied to a gate of the transistor T6B. A clock signal V(2λ+5) is applied to a gate of the transistor T6C. When the potential of the node N2, the clock signal V(2λ+1), the clock signal V(2λ+3), or the clock signal V(2λ+5) is at the H level, the output terminal NOUT(λ) is connected to the power supply VGL.

The reference point N1 is connected to the terminals NSF(λ) and NSB(λ) via the diode-connected transistors T1F and T1B, respectively. The transistors T1F and T1B function as a set circuit which sets the reference point N1 to the H level when an output pulse of another stage is input to the terminal NSF(λ) or NSB(λ).

The transistors T2, T9F, and T9B which are connected between the reference point N1 and the power supply VGL so as to be in parallel to one another function as switch elements which provide continuity/discontinuity between the reference point N1 and the power supply VGL. A gate of the transistor T2 is connected to the node N2, a gate of the transistor T9F is connected to the terminal NRF(λ), and a gate of the transistor T9B is connected to the terminal NRB(2). When the potential of the node N2, the terminal NRF(λ), or the terminal NRB(λ) is at the H level, these transistors set the potential of the reference point N1 to the L level. In particular, the transistors T9F and T9B function as a reset circuit which sets the reference point N1 to the L level when an output pulse of another stage is input to the terminal NRF(λ) or NRB(λ).

The transistor T4 is connected between the node N2 and the power supply VGL. A gate of the transistor T4 is connected to the reference point N1. Further, the capacitor C3 is connected between the node N2 and an input terminal of the clock signal V(2λ−1). The transistor T4 functions as a switch element which provides continuity/discontinuity between the node N2 and the power supply VGL. During a period in which the potential of the reference point N1 is at the H level, the transistor T4 is in the on state, and sets the potential of the node N2 to the L level. On the other hand, during a period in which the potential of the reference point N1 is at the L level, the transistor T4 is in the off state. In this state, when the clock signal V(2λ−1) is at the H level, the potential of the node N2 is pulled up to the H level via the capacitor C3.

Next, the unit register circuits 60 in the dummy stages are described. For the same reason as in the case of the first embodiment, the unit register circuits 60 in the μ-th stages (μ=1, 2), that is, in the top dummy stages, illustrated in FIG. 11 do not have the transistor T9B, and, correspondingly to this, do not have the terminal NRB. It is to be noted that the first and second stages have the terminals NSF, NSB, and NRF. Similarly to the case of the λth stage, a corresponding output signal in another stage is input to these terminals except the terminal NSF(1). Similarly to the case of the first embodiment, to the terminal NSF(1), a pulse of the forward direction trigger signal VSTF is input from the trigger signal generating portion 36 at the start of a forward shift.

The unit register circuit 60 in the μ-th stage (p=(N−1), N), that is, in a bottom dummy stage illustrated in FIG. 13 does not have the transistor T9F for the same reason as in the case of the first embodiment, and, correspondingly to this, does not have the terminal NRF. It is to be noted that the (N−1)th and N-th stages have the terminals NSF, NSB, and NRB. Similarly to the case of the λth stage, a corresponding output signal in another stage is input to these terminals except the terminal NSB(N). Similarly to the case of the first embodiment, to the terminal NSB(N), a pulse of the reverse direction trigger signal VSTB is input from the trigger signal generating portion 36 at the start of a backward shift.

Further, as described in the first embodiment, it is preferred that the size of the output transistors T5 in the dummy stages be made smaller than that in the main stages.

In the above, the structure of the gate line driving circuits 14 is described taking as an example the gate line driving circuit 14R for driving the odd-numbered gate signal lines 20. The structure of the gate line driving circuit 14L for driving the even-numbered gate signal lines 20 in this embodiment is similar to that of the gate line driving circuit 14R on the right side. In this regard, this embodiment is similar to the first embodiment, and thus, the description thereof is omitted.

Next, operation of the bidirectional shift register 30 is described. Timing diagrams illustrating waveforms of various signals in the forward shift operation and in the backward shift operation in this embodiment are the same as FIGS. 8 and 9, respectively, which are referred to in the first embodiment.

The forward shift starts by, at the head of image signals for one frame, generation of a pulse of the forward direction trigger signal by the trigger signal generating portion 36 (at the times t0 and t1 in FIG. 8). As described above, the clock signal generating portion 34 generates, in the forward shift operation, pulses in sequence in the forward direction.

Here, first, forward shift operation of the unit register circuit 60 in a main stage ($\lambda$th stage) in the gate line driving circuit 14R is described.

Before the operation in the $\lambda$th stage, the first to ($\lambda$−1)th stages are operated in sequence to output pulses having a width of 2H with a phase difference of 2H therebetween. When a pulse of the output signal G(2$\lambda$−3) in the ($\lambda$−1)th stage is input to the terminal NSF($\lambda$) (time t2 in FIG. 8), the reference point N1 is set to a potential (VGH-Vth (T1F)) corresponding to the H level to turn on the transistor T5, and the interterminal voltage of the capacitor C1 is set to the same potential. Here, the transistor T4 is turned on to set the node N2 to the L level. Therefore, the transistors T2 and T6 are in the off state.

At the time t3 after 2H from the time t2, a pulse of the output control clock signal V(2$\lambda$−1) is input to the drain of the transistor T5. The pulse of the clock signal V(2$\lambda$−1) pulls up the potential of the source of the transistor T5. Then, the potential of the reference point N1 is further pulled up by the bootstrap effect, and the pulse of the clock signal V(2$\lambda$−1) becomes a pulse of the signal G(2$\lambda$−1) without lowering the potential thereof to be output from the terminal NOUT($\lambda$). The pulse of the signal G(2$\lambda$−1) is input to the terminal NSF in the ($\lambda$+1)th stage, and sets the reference point N1 in that stage to the H level.

When, at the time t4, the pulse of the output control clock signal V(2$\lambda$−1) falls, the pulse of the signal G(2$\lambda$−1) also falls. Further, at this timing, a pulse of the clock signal V(2$\lambda$+1) turns on the transistor T6A, and thus, the output terminal NOUT($\lambda$) is connected to the power supply VGL and the output signal G(2$\lambda$−1) is at the L level. On the other hand, the potential of the reference point N1 is held at the H level (subsequent set period).

At the time t4, the ($\lambda$+1)th stage outputs a pulse of the signal G(2$\lambda$+1) in synchronization with the pulse of the clock signal V(2$\lambda$+1). In this way, each of the stages outputs a pulse of its own with a delay of 2H from the output of a pulse in the preceding stage. The ($\lambda$+2)th stage which receives the output of the pulse in the ($\lambda$+1)th stage outputs a pulse of the signal G(2$\lambda$+3) at a time t5 which is delayed by 2H from the time t4.

In the $\lambda$th stage, when the pulse of the signal G(2$\lambda$+3) is input to the terminal NRF at the time t5, the transistor T9F is turned on to reset the reference point N1 to the L level. At the same time, a pulse of a clock signal V(2$\lambda$+3) turns on the transistor T6B to hold the output signal G(2$\lambda$−1) at the L level. It is to be noted that, in the subsequent 2H period, the transistor T6C is turned on by a pulse of a clock signal V(2$\lambda$+5) to hold the output signal G(2$\lambda$−1) at the L level.

By the way, a pulse of the output control clock signal V(2$\lambda$−1) is applied to the drain of the transistor T5 even outside the set period of the reference point N1 (output period of the $\lambda$th stage), and the pulse has a function to pull up the potential of the reference point N1 via the gate-drain capacitance Cgd of the transistor T5. The potential fluctuations at the reference point N1 are suppressed by turning on the transistor T2. In a reset period of the reference point N1, the reference point N1 is basically at the L level and the transistor T4 is in the off state. In this state, as described above, the potential of the node N2 is pulled up to the H level according to a pulse of the output control clock signal V(2$\lambda$−1), and the transistors T2 and T6 are turned on. This fixes the reference point N1 to the L level in the reset period, and the output signal G(2$\lambda$−1) is held at the L level.

As described above, a main stage receives an output pulse from the previous stage to cause the reference point N1 to be in the set state, and receives an output pulse from the stage next to the subsequent stage to cause the reference point N1 to be in the reset state. However, the dummy stage as the first stage does not have the previous stage. Therefore, as described above, the first stage has a structure in which a pulse of the forward direction trigger signal VSTF is input to the terminal NSF. The first stage receives a pulse of the signal VSTF which is generated at the time t0 to set the reference point N1 to the H level. Operation in the first stage after this is similar to that in the $\lambda$th stage described above. As described above, the (N−1)th and N-th stages which are dummy stages do not have the reset terminal NRF. The reference point N1 in the (N−1)th and N-th stages is set to the H level at the end of the forward shift operation for one frame in that stage, and then is reset to the L level when the transistor T2 is turned on before the start of the subsequent frame. More specifically, as an inconvenience which results from setting the preceding set period to be long, as described above, the potential of the reference point N1 in the (N−1)th and N-th stages is lowered by a leakage current of the transistor T9B or T2. Here, the transistor T2 is, for example, designed to have a larger channel width than that of the transistor T4, and thus, the leakage current becomes larger accordingly. Further, a period in which the shift operation is suspended that occurs between frames correspondingly to a vertical blanking period is relatively long, during which the potential of the reference point N1 is lowered by a leakage current.

It is to be noted that there may be employed another structure in which the transistor (denotes as Tr), which is turned on by a pulse of a clock signal V(2$\mu$+3) ($\mu$=(N−1), N), is provided between the reference point N1 and the power supply VGL in the (N−1)th and N-th stages which are dummy stages, and the transistor Tr is turned on by a clock signal which is generated before the start of the shift operation for the subsequent frame to reset the reference point N1 in the dummy stages to the L level. In this structure, in the $\mu$-th stage which is a dummy stage, an output pulse is generated in synchronization with a clock signal V(2$\mu$−1). Taking into consideration that the reference point N1 cannot be reset to the L level at the timing of generating the output pulse and during the preceding set period therebefore and the subsequent set period thereafter, respectively, the transistor Tr is controlled by the clock signal V(2$\mu$+3) which generates a pulse at a timing which does not fall within such periods. Further, in the gate line driving circuit 14R which is driven by four-phase clock signals, when the transistor T9B which is controlled by the output signal G(2$\lambda$−5) is turned on, the transistor Tr is also turned on, and thus, in the structure in which the transistor Tr is provided, the transistor T9B in the (N−1)th and N-th stages which are dummy stages may be eliminated. Similarly, in the first and second stages which are dummy stages ($\mu$=1, 2), the transistor Tr may also be provided to reset the potential of the reference point N1 to the L level in the backward shift operation. In this embodiment, the transistor Tr in the first and second stages which are dummy stages may also be controlled by the clock signal V(2$\mu$+3), and the transistor T9F may also be eliminated.

The forward shift operation of the stages in the gate line driving circuit 14R is described above. The forward shift operation of the stages in the gate line driving circuit 14L is similar to that of the corresponding stages in the gate line driving circuit 14R. However, the stages in the gate line driving circuit 14L operate at a timing 1H behind the corresponding stages in the gate line driving circuit 14R, respectively.

The backward shift starts by, at the head of image signals for one frame, generation of a pulse of the reverse direction trigger signal by the trigger signal generating portion 36 (at the times t0 and t1 in FIG. 9). As described above, the clock signal generating portion 34 generates, in the backward shift operation, pulses in sequence in the reverse direction.

Similarly to the case of the unit register circuits 38 in the first embodiment, in the unit register circuits 60 in each of the main stages of the shift register portion 32, the set terminals and the reset terminals are in a symmetrical relationship in structure with respect to the forward shift and the backward shift. Further, similarly to the first embodiment, the top dummy stages and the bottom dummy stages are in a symmetrical relationship in structure with respect to shifts in opposite directions. Therefore, if the control circuit 18 switches the trigger signals and switches the order of generation of the clock pulses, the shift register portion 32 performs the backward shift operation similarly to the forward shift operation.

For example, in the N-th stage in the gate line driving circuit 14R, a pulse of the reverse direction trigger signal VSTB is input to the terminal NSB at the time t1 and the reference point N1 is set to the H level. After that, in synchronization with a pulse of a clock signal V(2N-1) which is generated first, a pulse is generated in an output signal G(2N-1). In this way, pulses are output from the stages in sequence in the opposite order to that in the forward shift operation.

The backward shift operation is described in the above taking as an example the gate line driving circuit 14R. The backward shift operation of each of the stages in the gate line driving circuit 14L is similar to that of the corresponding stage in the gate line driving circuit 14R. However, each of the stages in the gate line driving circuit 14L performs operation with an advance of 1H from the corresponding stage in the gate line driving circuit 14R.

It is to be noted that various kinds of variations in structure described in the first embodiment may also be adopted in the bidirectional shift register according to this embodiment.

Further, the transistor Tr described as a transistor in the dummy stages may also be adopted in the main stages to eliminate at least one of the transistors T9F and T9B in the main stages. In particular, in the above-mentioned gate line driving circuits 14 which are driven by four-phase clock signals (n=4 and βf=βb=2), by providing one transistor Tr which is controlled by the clock signal V(2λ+3), both of the transistors T9F and T9B may be eliminated. Such a structure in which one transistor Tr is provided to eliminate both of the transistors T9F and T9B is possible generally when βf+βb=n.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A bidirectional shift register circuit comprising:
   four clock signal lines supplying four-phase clock pulses respectively;
   a plurality of cascade-connected register circuits including a top dummy register circuit, a bottom dummy register circuit, and main register circuits providing between the top dummy register circuit and the bottom dummy register circuit; and
   a common signal line supplying a common signal to the plurality of cascade-connected register circuits respectively,
   wherein each of the plurality of cascade-connected register circuits has
      a forward set terminal;
      a backward set terminal;
      a reset terminal;
      a first node;
      a second node;
      an output circuit which outputs one of the four-phase clock pulses when a voltage of the first node is a high level;
      a first node set circuit which sets a voltage of the first node to the high level when a set signal is input into the forward set terminal or the backward set terminal;
      a second node set circuit which sets a voltage of the second node to a high level when other one of the four-phase clock pulses is input into the reset terminal;
      a first node control circuit which sets the first node to a low level when a voltage of the second node is the high level; and
      a second node control circuit which sets the second node to a low level when a voltage of the first node is the high level,
   wherein the bottom dummy register circuit has a second node reset circuit which sets the second node to the low level when the common signal is input into the bottom dummy register circuit, and
   wherein the top dummy register circuit has a second node reset circuit which sets the second node to the low level when the common signal is input into the top dummy register circuit.

2. The bidirectional shift register circuit according claim 1, wherein:
   the first node of the top dummy register circuit is set by a start signal when forward shift operation, and
   the first node of the bottom dummy register circuit is set by the start signal when the backward shift operation.

3. The bidirectional shift register circuit according claim 1, wherein:
   the first node of the main register circuit is set by the output pulse from previous stage, and
   the first node of the main register circuit is reset by the pulse signal which output pulse form subsequent stage.

4. The bidirectional shift register circuit according claim 1, wherein:
   the common signal is input from out of the plurality of cascade-connected register circuits.

5. The bidirectional shift register circuit according claim 1, wherein:
   periods of a high level of the four-phase clock pulses do not overlap each other.

6. The bidirectional shift register circuit according claim 1, further comprise:
   a second output circuit which output the low level voltage when the voltage of the second node is the high level.

7. A bidirectional shift register circuit comprising:
   four clock signal lines supplying four-phase clock pulses respectively;
   a plurality of cascade-connected register circuits including a top dummy register circuit, a bottom dummy register circuit, and main register circuits providing between the top dummy register circuit and the bottom dummy register circuit; and a common signal line supplying a common signal to the plurality of cascade-connected register circuits respectively, wherein each of the plurality of cascade-connected register circuits has a forward set terminal;

a backward set terminal;

a reset terminal;

a first node;

a second node;

an output transistor which outputs one of the four-phase clock pulses when a voltage of the first node is a high level;

a first node set circuit which sets a voltage of the first node to the high level when a set signal is input into the forward set terminal or the backward set terminal;

a second node set circuit which sets a voltage of the second node to a high level when other one of the four-phase clock pulses is input into the reset terminal;

a first node control circuit which sets the first node to a low level when a voltage of the second node is the high level; and a second node control circuit which sets the second node to a low level when a voltage of the first node is the high level, wherein the bottom dummy register circuit has a second node reset circuit which sets the second node to the low level when the common signal is input into the bottom dummy register circuit, wherein the top dummy register circuit has a second node reset circuit which sets the second node to the low level when the common signal is input into the top dummy register circuit, and wherein a size of the output transistor of the main register circuit is larger than that of the top and bottom dummy register circuit.

8. The bidirectional shift register circuit according claim 7, wherein:

the first node of the top dummy register circuit is set by a start signal when forward shift operation, and the first node of the bottom dummy register circuit is set by the start signal when the backward shift operation.

9. The bidirectional shift register circuit according claim 7, wherein:

the first node of the main register circuit is set by the output pulse from previous stage, and the first node of the main register circuit is reset by the pulse signal which output pulse form subsequent stage.

10. The bidirectional shift register circuit according claim 7, wherein:

the common signal is input from out of the plurality of cascade-connected register circuits.

11. The bidirectional shift register circuit according claim 7, wherein:

periods of a high level of the four-phase clock pulses do not overlap each other.

12. The bidirectional shift register circuit according claim 7, further comprise:

a second output transistor which output the low level voltage when the voltage of the second node is the high level.

\* \* \* \* \*